(12) United States Patent
Galburt et al.

(10) Patent No.: US 6,307,619 B1
(45) Date of Patent: Oct. 23, 2001

(54) SCANNING FRAMING BLADE APPARATUS

(75) Inventors: Daniel N. Galburt, Wilton; Waiming Tam, Danbury, both of CT (US)

(73) Assignee: Silicon Valley Group, Inc., San Jose, CA (US)

( * ) Notice: Subject to any disclaimer, the term of this patent is extended or adjusted under 35 U.S.C. 154(b) by 0 days.

(21) Appl. No.: 09/534,127

(22) Filed: Mar. 23, 2000

(51) Int. Cl.[7] .............................. G03B 27/42; G03B 27/54; G03B 27/72; H02K 41/00
(52) U.S. Cl. ................................ 355/53; 355/67; 355/71; 318/135; 310/12
(58) Field of Search .................................. 355/53, 67, 71, 355/74; 356/399, 400, 401; 318/653, 687, 135; 310/12

(56) References Cited

U.S. PATENT DOCUMENTS

| | | | |
|---|---|---|---|
| 4,472,824 | 9/1984 | Buckley | 378/34 |
| 4,507,597 | 3/1985 | Trost | 318/653 |
| 4,719,705 | 1/1988 | Laganza et al. | 33/568 |
| 4,907,035 | 3/1990 | Galburt et al. | 356/150 |
| 4,986,007 | 1/1991 | Laganza et al. | 33/621 |
| 5,285,142 | 2/1994 | Galburt et al. | 318/640 |
| 5,686,997 | * 11/1997 | Shirasu | 355/53 |
| 5,727,685 | 3/1998 | Laganza et al. | 206/455 |
| 5,767,523 | 6/1998 | McCullough | 250/548 |
| 5,874,820 | * 2/1999 | Lee | 355/53 |
| 5,895,737 | 4/1999 | McCullough et al. | 430/30 |
| 5,920,396 | 7/1999 | Markoya et al. | 356/400 |
| 6,040,893 | * 3/2000 | Ebinuma | 355/53 |

* cited by examiner

Primary Examiner—Alan A. Mathews
(74) Attorney, Agent, or Firm—Sterne, Kessler, Goldstein & Fox P.L.L.C.

(57) ABSTRACT

A scanning framing blade apparatus includes a stationary assembly having a plurality of magnets; first and second carriage assemblies that each have a plurality of coils. The first and second carriage assemblies are supported on the stationary assembly by a plurality of air bearings that permit the first and second carriage assemblies to move in only one degree of freedom. In addition, the scanning framing blade apparatus includes first and second framing blades that are attached to the first and second carriage assemblies, respectively. The scanning framing blade apparatus also includes a controller that is coupled to the plurality of coils. The controller is adapted to energize at least one of the plurality of coils, thereby causing at least one of the carriage assemblies and corresponding framing blade to move in the one degree. This motion controls illumination onto a reticle during a substrate scanning process.

14 Claims, 18 Drawing Sheets

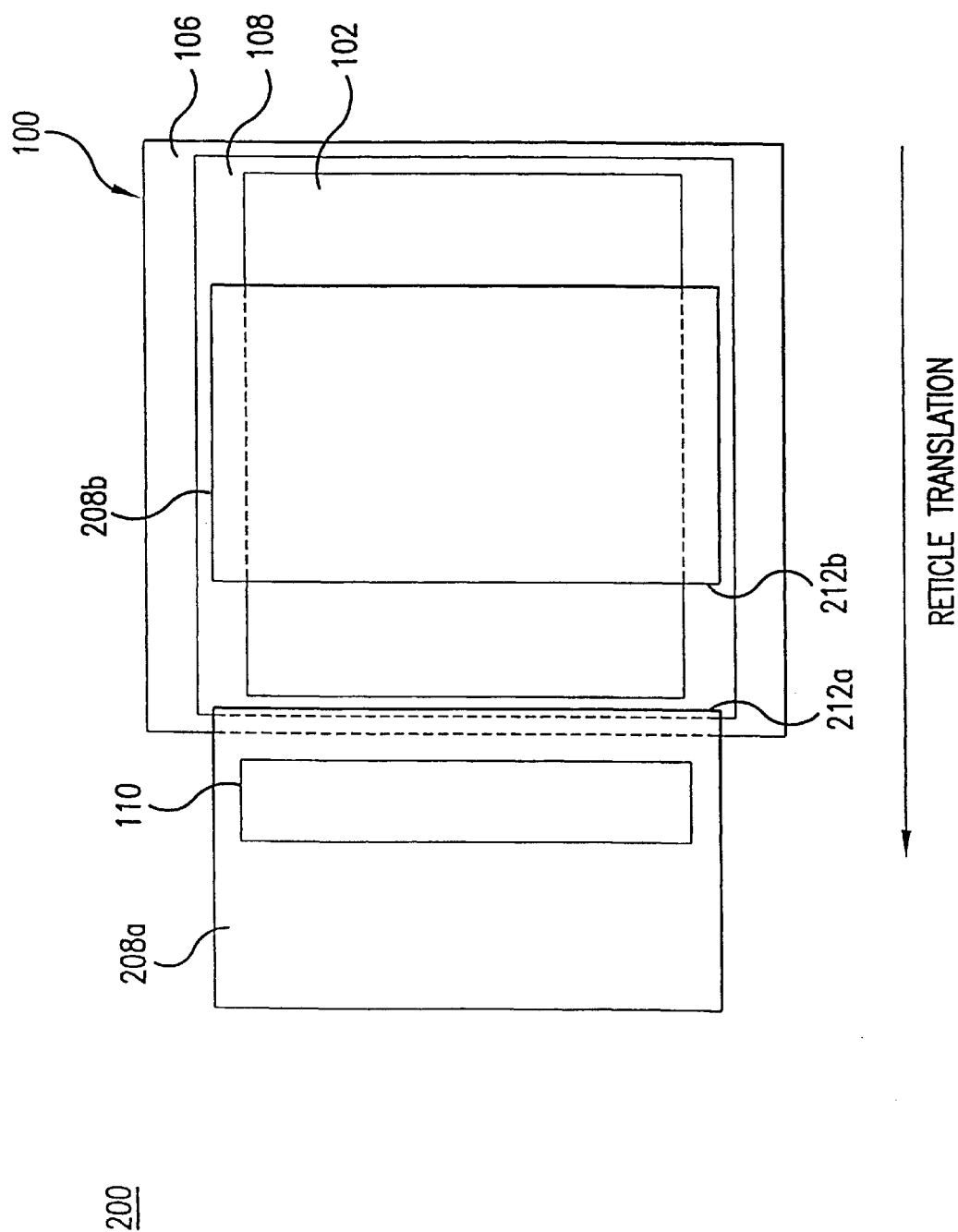

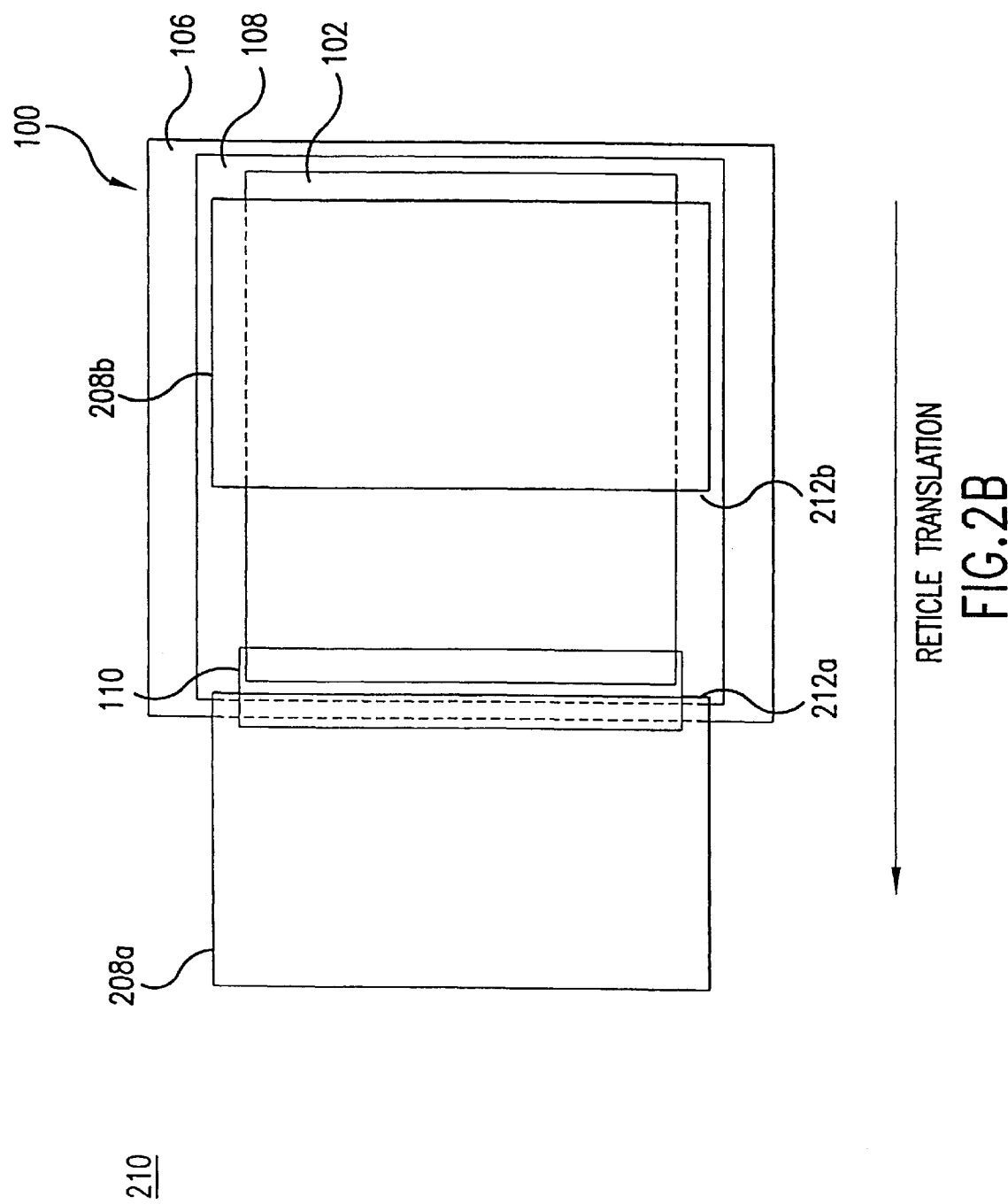

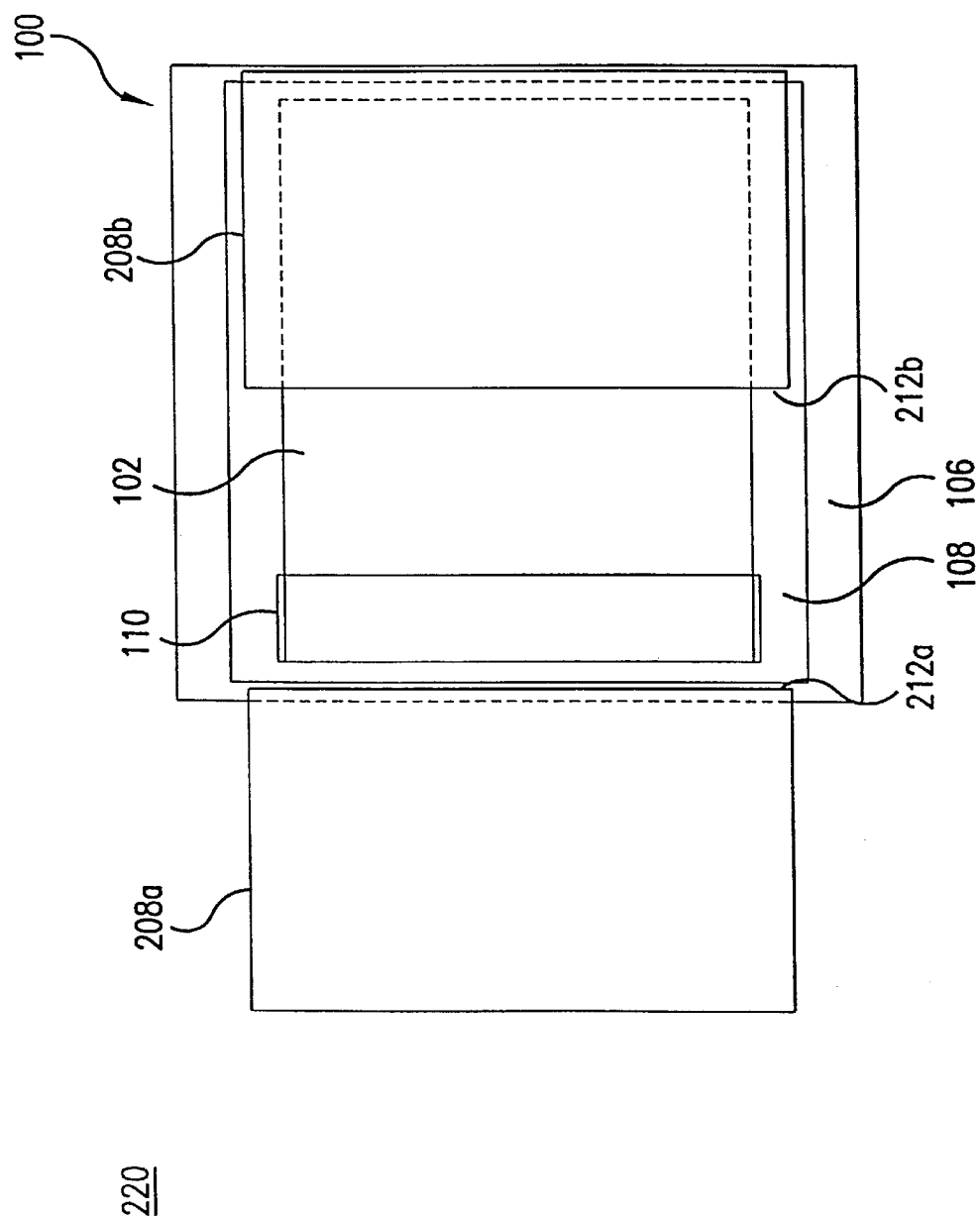

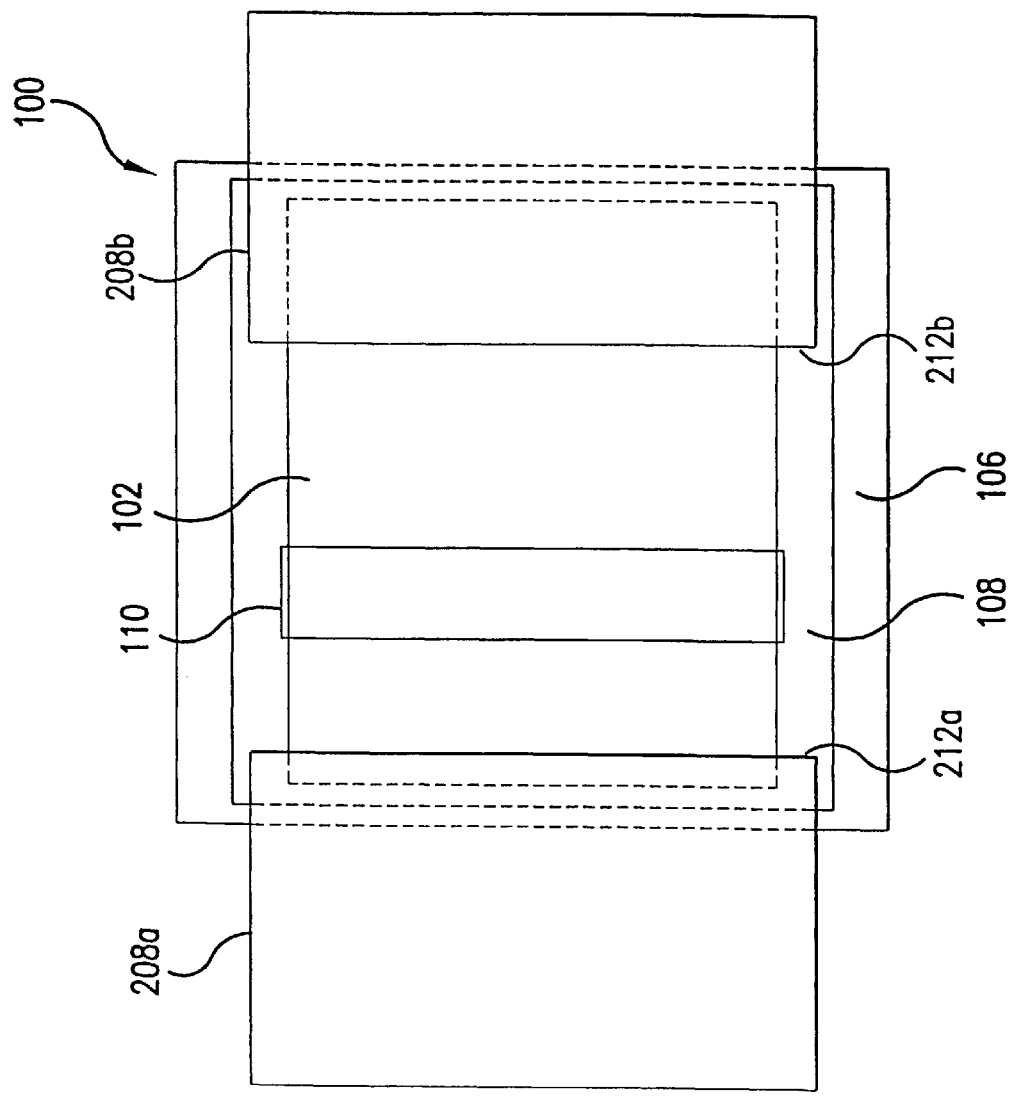

SCANNING FRAMING BLADE APPARATUS

BACKGROUND OF THE INVENTION

1. Field of the Invention

This invention relates to lithography. More specifically, this invention relates to a scanning framing blade apparatus.

2. Related Art

Lithography is a process used to create features on the surface of substrates. Examples of substrates include those used in the manufacture of flat panel displays, circuit boards, various integrated circuits, and the like. A semiconductor wafer, for example, can be used as a substrate to fabricate an integrated circuit.

During lithography, a reticle is used to transfer a desired pattern onto a substrate. The reticle is formed of a material transparent to the lithographic wavelength being used, for example glass in the case of visible light. The reticle has an image printed on it. The size of the reticle is chosen for the specific system in which it is used. For example, a reticle six inches by six inches and one-quarter inch thick can be used. During lithography, an illumination source illuminates a reticle that is disposed on a reticle stage. This illumination exposes an image onto a substrate that is disposed on a substrate stage. The image exposed onto the substrate corresponds to the image printed on the reticle.

The projected image produces changes in the characteristics of a layer, for example photoresist, deposited on the surface of the substrate. These changes correspond to the features projected onto the substrate during exposure. Subsequent to exposure, the layer can be etched to produce a patterned layer. The pattern corresponds to those features projected onto the substrate during exposure. This patterned layer is then used to remove exposed portions of underlying structural layers within the substrate, such as conductive, semiconductive, or insulative layers. This process is then repeated, together with other steps, until the desired features have been formed on the surface of the substrate.

An illumination source in a lithography process projects an illumination beam. The cross section of an illumination beam that is incident on a reticle is referred to herein as an illumination slot. Often, an illumination slot is narrower than an image printed on a reticle. In this case, scanning techniques are employed to project an entire reticle image onto a substrate. Scanning techniques involve scanning a reticle across an illumination slot to allow the full reticle pattern to be exposed onto a substrate that is simultaneously being scanned. Such techniques involve reticle stages and substrate stages that move with respect to the illumination source.

Scanning techniques must employ measures to prevent certain types of exposures, such as pin hole exposures, onto a substrate. Pin holes are small translucent defects that exist in opaque border areas surrounding a reticle image (also referred to as a field pattern). Pin hole exposures occur when illumination passes through one or more pin holes existing on a reticle. Border areas commonly have pin holes. As a reticle is scanned across an illumination slot, moments occur when portions of the border area are within the illumination slot. If pin holes exist in the border area, these pin holes will create unintentional exposures onto a substrate.

One measure taken to prevent pin hole exposure is the application of materials such as chrome to border areas. Materials such as these cover pin holes, thereby preventing pin hole exposure during scanning. Unfortunately, such measures are costly.

Another measure taken to prevent pin hole exposure involves the use of framing blades. Framing blades are physical objects having surfaces that obstruct areas of a reticle from an illumination slot. Common framing blade implementations mount framing blades on a reticle stage, thereby enabling the mounted framing blades and a reticle to move in unison as they pass across an illumination slot. Drawbacks with this approach exist, however. For instance, the mounting of framing blades can place excessive weight on a reticle stage.

Another drawback associated with the mounting of framing blades on a reticle stage involves the adjustment of reticle field sizes. A reticle field is the area of a reticle that is exposed onto a substrate. In addition to preventing pin hole exposure, framing blades are used to establish the width of a reticle field. Often, it is desirable to expose only a portion of a reticle's image area onto a substrate. In these cases, the field width is narrower than the reticle's image area. Moreover, during the operation of a lithography process, it is sometimes required to change a reticle's field width between scans. When framing blades are mounted on a reticle stage, changing a reticle's field width is a slow process because the reticle stage needs to be stopped to allow physical repositioning of the mounted framing blades.

What is needed is a synchronized framing blade apparatus that avoids the above drawbacks and is synchronized with the scanning operation.

SUMMARY OF THE INVENTION

The present invention is directed to a scanning framing blade apparatus. According to the present invention, a scanning framing blade apparatus includes a stationary assembly having a plurality of magnets, and first and second carriage assemblies that each have a plurality of coils. The first and second carriage assemblies are supported on the stationary assembly by a plurality of air bearings that permit the first and second carriage assemblies to move in only one degree of freedom. In addition, the scanning framing blade apparatus includes first and second framing blades that are attached to the first and second carriage assemblies, respectively. The scanning framing blade apparatus also includes a controller that is coupled to the plurality of coils. The controller is adapted to energize at least one of the plurality of coils, thereby causing at least one of the carriage assemblies and corresponding framing blade to move in the one degree of freedom. This motion controls illumination onto a reticle during a substrate scanning process to avoid exposure through pin holes.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. Like reference numbers refer to like elements within the different figures.

FIGS. 2A–2H are illustrations of framing blade operation, according to the present invention.

DETAILED DESCRIPTION OF THE PREFERRED EMBODIMENTS

1. Synchronized Scanning Framing Blades

Figure 1:
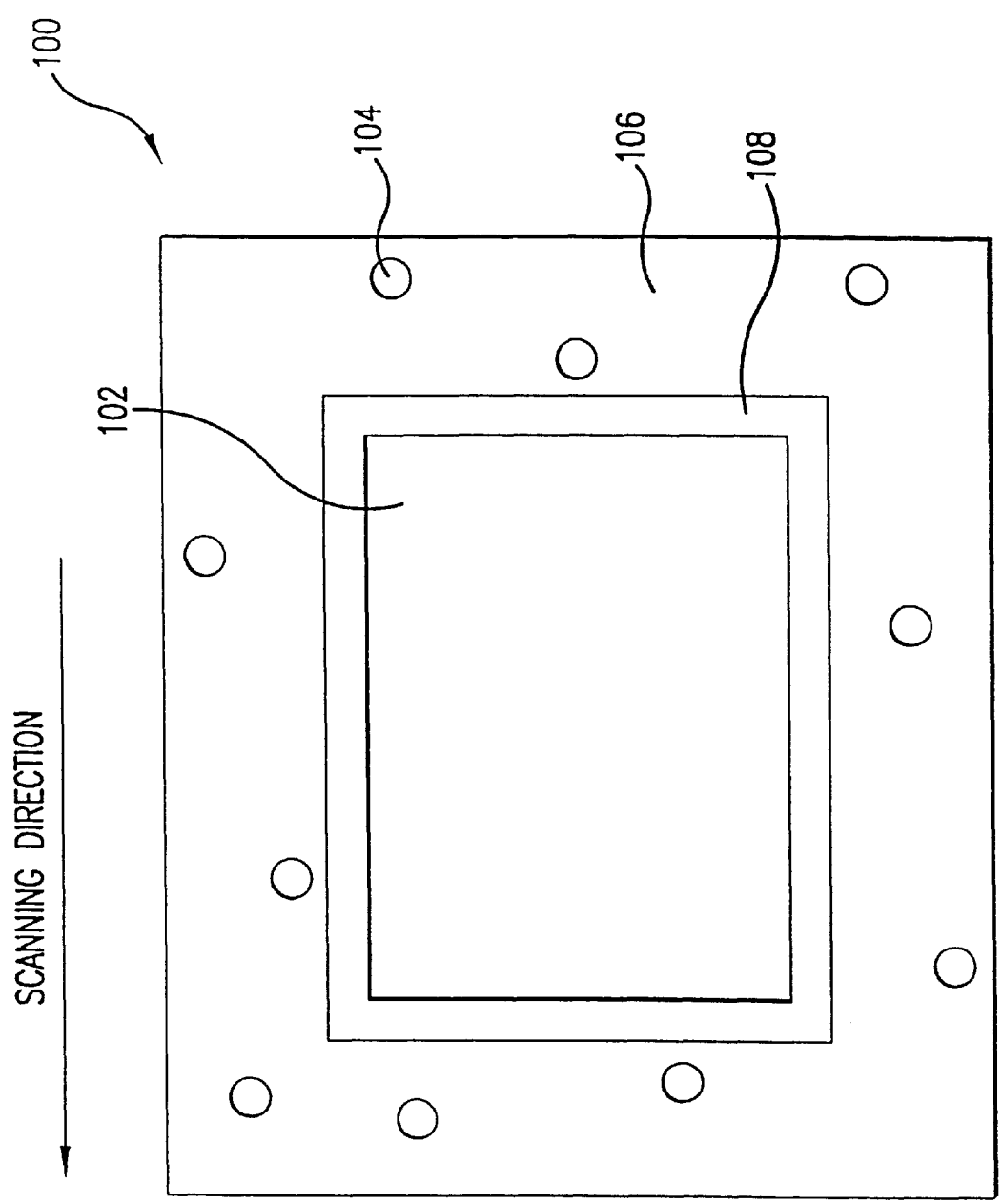
FIG. 1 is an illustration of a reticle.

FIG. 1 illustrates an exemplary reticle 100. The exemplary reticle 100 comprises three regions: a field pattern 102, a pin hole area 106, and a pin hole free area 108. The field pattern 102 contains an image that is projected onto a surface of a substrate (not shown), like a semiconductor wafer. The pin hole free area 108 is the area immediately surrounding the circumference of the field pattern 102. The pin hole area 106 surrounds the outer perimeter of the pin hole free area 108 and extends to the edges of the reticle 100.

The reticle 100 passes across an illumination slot 110 according to an operation known as substrate scanning. During substrate scanning, the reticle 100 moves in a scanning direction across the illumination slot 110. As the reticle 100 passes across the illumination slot 110, an illumination source exposes patterns printed on the reticle 100 onto a substrate via an optics system. During a scanning operation in the scanning direction illustrated in FIG. 1, the regions of the reticle 100 pass across the illumination slot 110 in the following order: the pin hole area 106, the pin hole free area 108, the field pattern 102, the pin hole free area 108, and the pin hole area 106.

The field pattern 102 is the only portion of the reticle 100 that is designed to have translucent portions. The remaining portions of the reticle 100 are prone to defects known as pin holes 104. Pin holes 104 are small translucent areas on the reticle 100. The pin holes 104 shown in FIG. 1 are magnified for illustrative purposes. Although pin holes 104 can be any size, pin holes 104 are typically on the order of 0.5 microns in size.

Pin holes 104 can be removed by applying materials such as chrome to the reticle 100. The pin hole free area 108, which does not contain any pin holes 104, is created by such a technique. The pin hole free area 108 provides a precise opaque border for the field pattern 102.

Unfortunately, the process of checking for pin holes 104 and patching them with a material such as chrome is an expensive process that requires multiple iterations of inspection and application of a material such as chrome to the reticle 100. Therefore, it is costly, timely, and impractical to make every region on the reticle 100 that is outside the field pattern 102 pin hole free. Consequently, the pin hole area 106 contains pin holes 104.

During a substrate scanning operation, the reticle 100 passes across the illumination slot 110. As this occurs, a pair of synchronized scanning framing blades move in a manner that obstructs portions of the reticle 100 from the illumination slot 110. As a result of this obstruction, these portions of the reticle 100 are not projected onto a substrate. Examples of these obstructed portions include the pin hole area 106 and/or areas of the field pattern 102 that are not designated for exposure.

FIGS. 2A–2H illustrate an exemplary operation of synchronized scanning framing blades according to the present invention. These figures provide a set of snapshots that sequentially illustrate a scanning operation, and show the reticle 100 moving from right to left. However, a similar operation can be performed in the reverse direction. Each of these snapshots illustrates the illumination slot 110, the reticle 100, a first framing blade 208a, and a second framing blade 208b. The first framing blade 208a includes a first framing edge 212a. The second framing blade 208b includes a second framing edge 212b that confronts the first framing edge 212a. As described above, the reticle 100 comprises the field pattern 102, the pin hole free area 108, and the pin hole area 106. The operation described in FIGS. 2A–2H obstructs the pin hole area 108 from the illumination slot 110 during a scanning operation.

FIG. 2A illustrates snapshot 200. This snapshot illustrates the scanning operation before the reticle 100 passes across the illumination slot 110. In this snapshot, both the reticle 100 and the first framing blade 208a are moving to the left (see arrow labeled Reticle Translation). However, during this snapshot, the second framing blade 208b is stationary.

FIG. 2B illustrates snapshot 210. Snapshot 210 follows snapshot 200. In this snapshot, the reticle 100 is moving to the left at a constant velocity and a portion of the field pattern 102 is already crossing the illumination slot 110. A portion of the pin hole area 108 is also crossing the illumination slot 110. The first framing blade 208a is also moving to the left at the same constant velocity. In this snapshot, the first edge 212a is aligned with the reticle 100 in a manner that obstructs the pin hole area 104 from the illumination slot 110. Thus, the first framing blade 208a prevents pin hole exposure. The second framing blade 208b remains stationary in this snapshot.

FIG. 2C illustrates snapshot 220. Snapshot 220 follows snapshot 210. In this snapshot, the reticle 100 is traversing the illumination slot 110 at a constant velocity to the left for exposure of the field pattern 102 onto a substrate (e.g., the invention is applicable for lithography of semiconductor wafers, liquid crystal displays, and the like). The first framing blade 208a is also moving to the left. However, since the pin hole area 104 is no longer aligned with the illumination slot 110, the first framing blade 208a does not obstruct any portion of the reticle 100 from the illumination slot 110. In this snapshot, the second framing blade 208b remains stationary.

FIG. 2D illustrates snapshot 230. Snapshot 230 follows snapshot 220. In snapshot 230, the reticle 100 continues to traverse the illumination slot 110 at a constant velocity. The first framing blade 208a also continues to move to the left. However, it does not obstruct any portion of the reticle 100 from the illumination slot 110 since the pin hole area 104 is no longer aligned with the illumination slot 10. In this snapshot, the second framing blade 208b remains stationary.

Figure 2E:
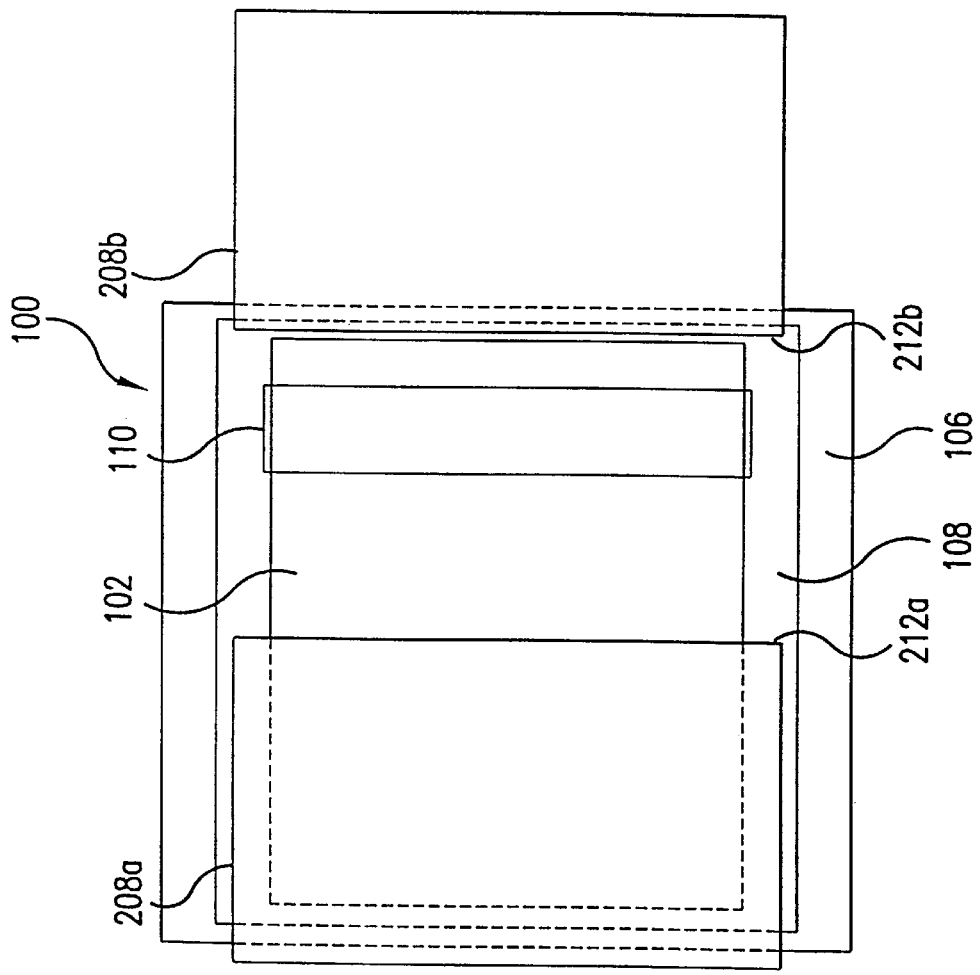

FIG. 2E illustrates snapshot 240. Snapshot 240 follows snapshot 230. In snapshot 240, the reticle 100 continues to traverse the illumination slot 110 at a constant velocity. However, the first framing blade 208a has come to a stop. In this snapshot, the second framing blade 208b is now moving in the same direction as the reticle 100.

Figure 2F:
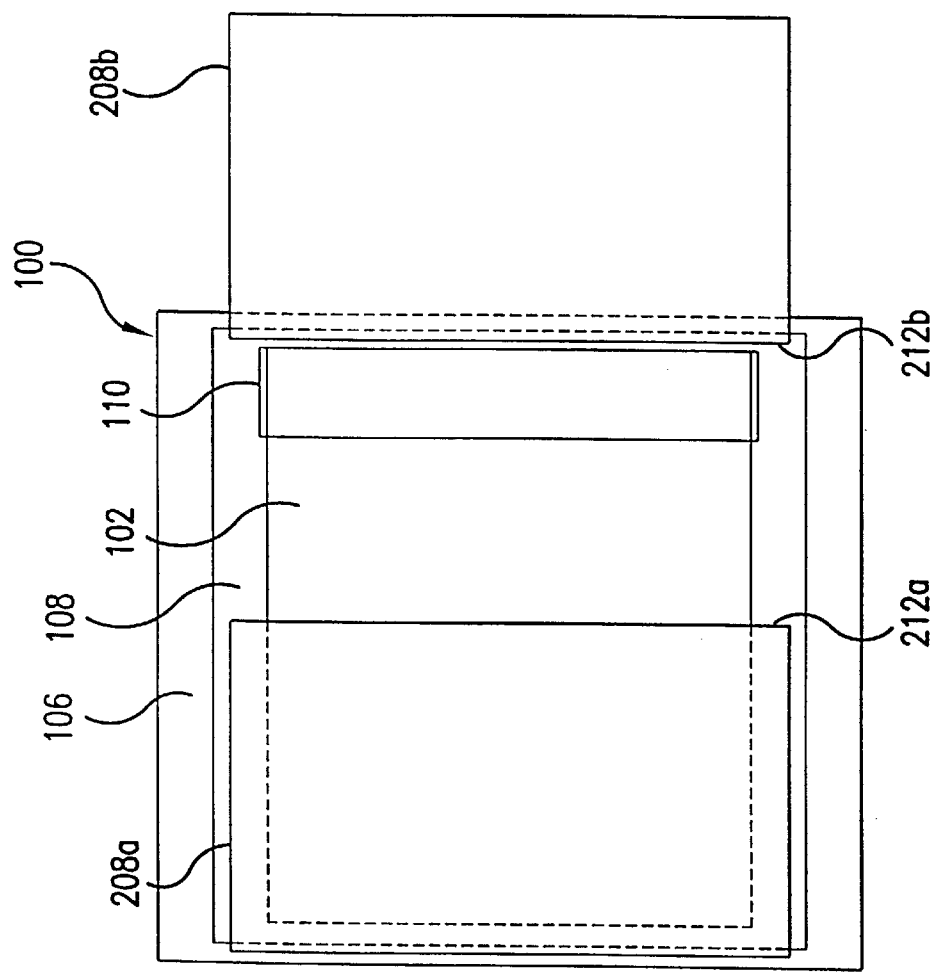

FIG. 2F illustrates snapshot 250. Snapshot 250 follows snapshot 240. In snapshot 250, the reticle 100 continues to traverse across the illumination slot 110 at a constant velocity. In addition, the second framing blade 208b is now moving to the left with the same constant velocity as the reticle 100.

Figure 2G:
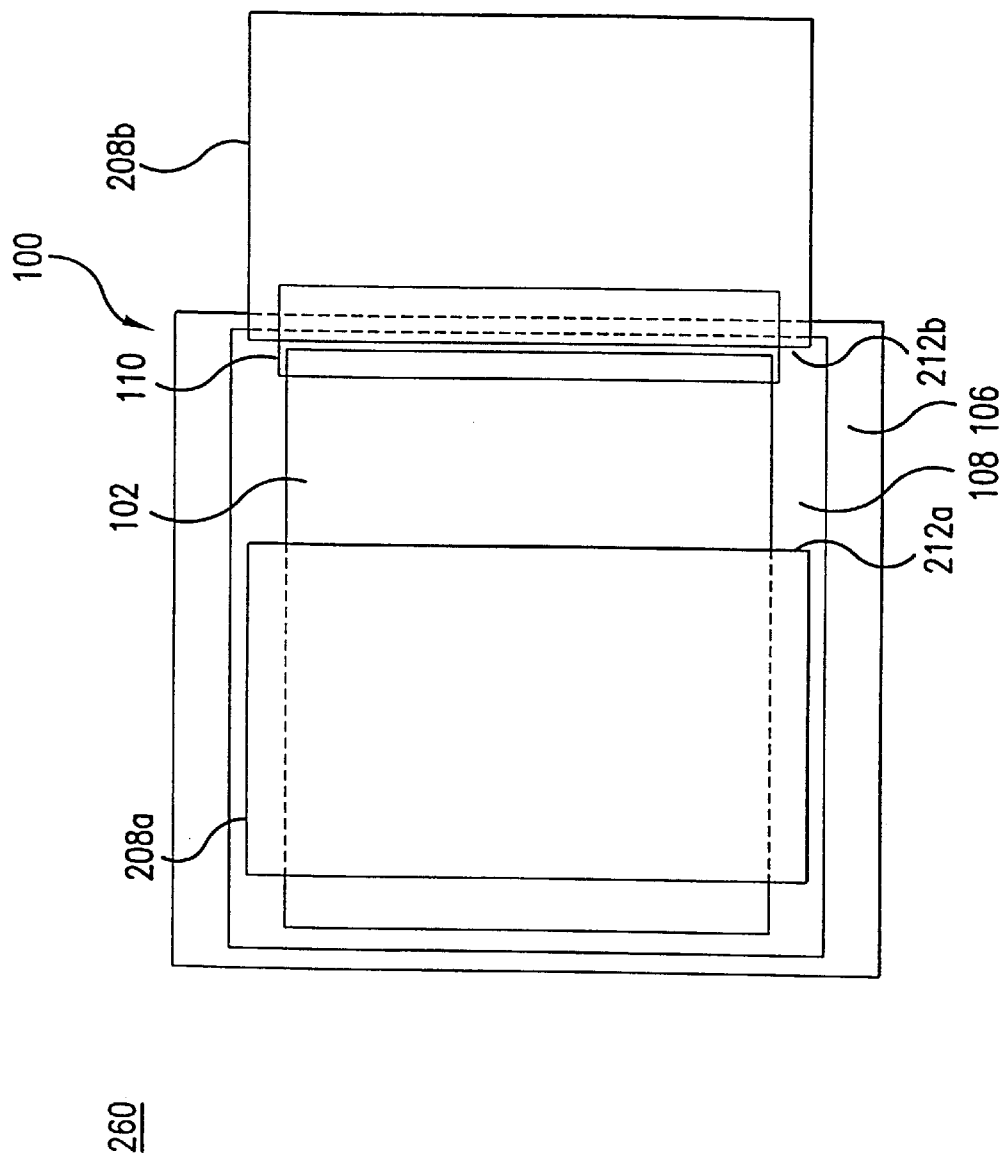

FIG. 2G illustrates snapshot 260. Snapshot 260 follows snapshot 250. In snapshot 260, the reticle 100 continues to traverse across the illumination slot 110 at a constant velocity. At this stage, portions of the pin hole area 104 are aligned with the illumination slot 110. Thus, the second edge 212b is aligned with the reticle 100 in a manner that obstructs the pin hole area 104 from the illumination slot 110. This alignment prevents pin hole exposure.

Figure 2H:
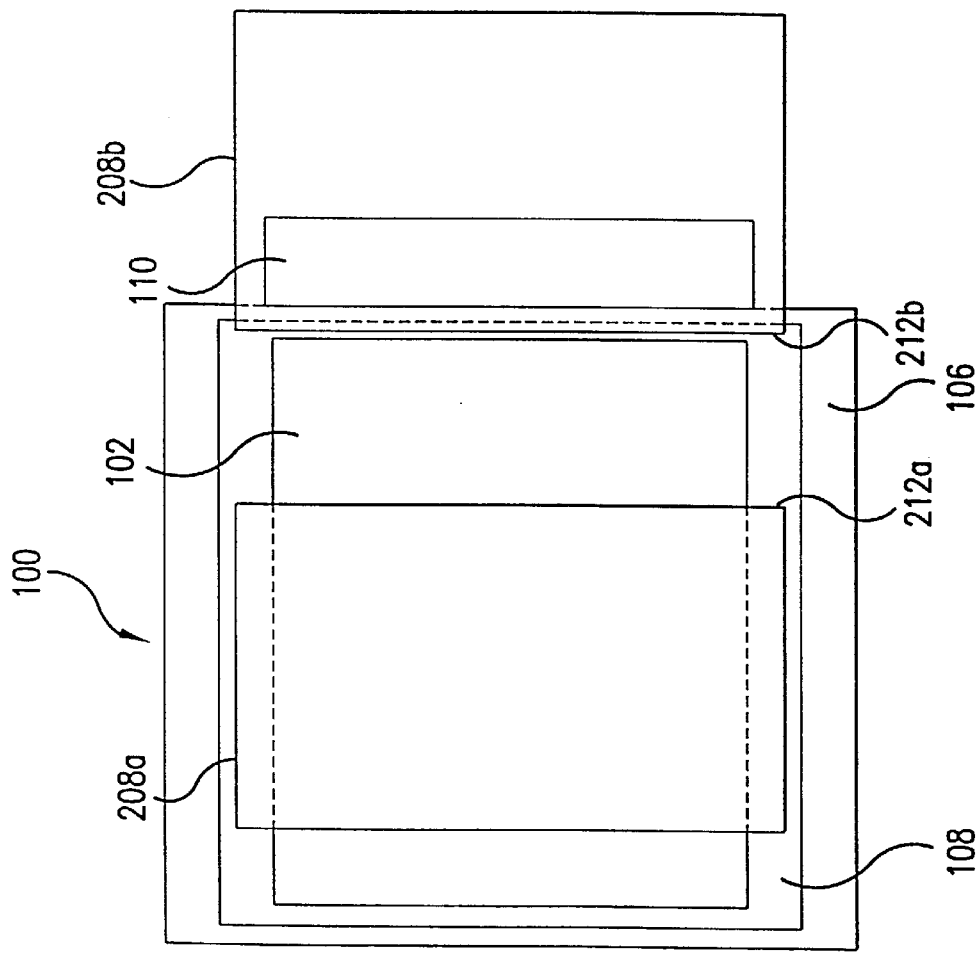

FIG. 2H illustrates snapshot 270. Snapshot 270 follows snapshot 260. In this snapshot, the reticle scanning process is finished. The reticle 100 has completely traversed the illumination slot. Thus, the field pattern 102 is exposed onto a substrate. The second framing blade 208b has completed its motion across the illumination slot 110 to prevent pin hole exposure. At this stage, the first and second framing blades 208a and 208b are positioned to perform a scan in the reverse direction.

2. Scanning Framing Blade Apparatus

Figure 3:
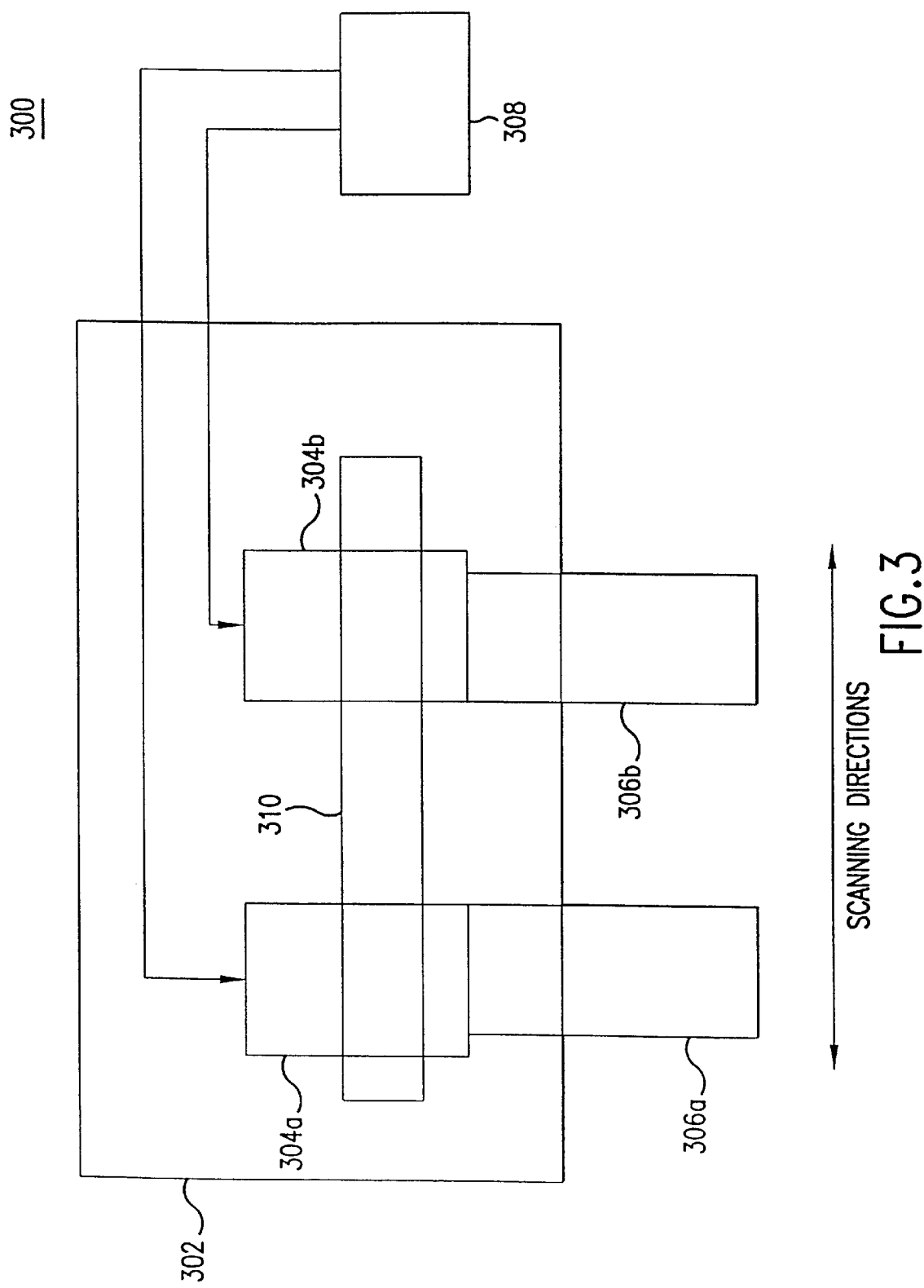
FIG. 3 is an illustration of a scanning framing blade apparatus, according to the present invention.

FIG. 3 illustrates a block diagram of a scanning framing blade apparatus 300 according to the present invention. The scanning framing blade apparatus 300 is not mounted on a reticle stage, and is capable of performing the synchronized scanning framing blade operation described above with reference to FIG. 2. An advantage of the present invention is that the scanning framing blade apparatus 300 does not place any weight on a reticle stage. The scanning framing blade apparatus 300 comprises a stationary assembly 302, a first carriage assembly 304a, a second carriage assembly 304b, a first framing blade 306a, a second framing blade 306b, a controller 308, and a position determination mechanism 310.

The stationary assembly 302 comprises a plurality of magnets (not shown) and a plurality of track surfaces (not shown). The first and second carriage assemblies 304a and 304b are supported on the stationary assembly 302 at these track surfaces by a plurality of air bearings (not shown). The air bearings permit first and second carriage assemblies to move in only one degree of freedom, as will be described below.

The first and second framing blades 306a and 306b are attached to the first and second carriage assemblies 304a and 304b, respectively. Like the first and second carriage assemblies 304a–b, the first and second framing blades 306a–b are permitted to move in only one degree of freedom. In this case, the one degree of freedom is illustrated by an arrow labeled scanning directions The first and second carriage assemblies 304a and 304b each comprise a plurality of coils (not shown). These coils are electrically connected to the controller 308. The controller 308 energizes these coils in a manner that causes them to interact with the plurality of magnets on stationary assembly 302. This interaction causes the first and second carriage assemblies 304a and 304b, as well as the first and second framing blades 306a and 306b, to move in only one degree of freedom. Thus, each carriage assembly 304 operates with the stationary assembly 302 as a linear motor. The manner in which the controller 308 energizes the coils in each of the first and second carriage assemblies 304a and 304b is known as commutation. The theory and implementation of commutation is well known to persons skilled in the relevant arts.

The position determination mechanism 310 determines the positions of the first and second framing blades 306a and 306b and provides framing blade position information to the controller 308. In a preferred embodiment, the position determination mechanism 310 comprises two encoder scales and two optical readers (not shown). Each encoder scale is connected to a corresponding carriage assembly 304. Each optical reader is connected to the stationary assembly 302 and corresponds to a particular encoder scale. When either first carriage assembly 304a or second carriage assembly 304b moves, the corresponding encoder scale moves with it. Each optical reader detects the position and/or motion of the corresponding encoder scale and generates a signal representing this motion and/or position. This signal is transmitted to the controller 308. Optical readers and encoder scales are well known to persons skilled in the relevant arts. In alternate embodiments, the position determination mechanism 310 can be implemented with other devices and techniques known to persons skilled in the relevant arts.

As described above, the controller 308 energizes the coils in each carriage assembly 304. This causes each of the first and second carriage assemblies 304a and 304b to move in a single degree of freedom. At any particular time, the controller 308 can cause either a single carriage assembly 304 to move, or both the first and second carriage assemblies 304a and 304b to move simultaneously in any direction (e.g., +y or −y).

According to a method of the present invention, the controller 308 receives one or more commands from a master control system (not shown). These commands direct the controller 308 to cause each carriage assembly 304 to move in a particular manner. Examples of such commands include position, speed, and acceleration directives. However other commands, such as timing directives, can be employed without departing from the scope of the present invention. Further, the controller receives framing blade position information from the position determination mechanism 310. Also according to the method, the controller 308 processes this information and energizes the coils in each carriage assembly 304 to drive the first and second framing blades 306a and 306b in a manner that is consistent with the one or more commands received from the master control system.

The scanning framing blade apparatus 300 controls illumination onto a reticle during a substrate scanning process. In a preferred embodiment, the controller 308 causes the first and second framing blades 306a and 306b to move in synchronization with a scanning reticle to prevent pinhole exposure onto a substrate and/or control the reticle field width. Controlling the reticle field width includes the first and second framing blades 306a and 306b obstructing portions of the field pattern 102 so that only portions of the field pattern 102 are exposed onto a substrate. The width of the exposed reticle portion is referred to herein as the field width.

In a preferred embodiment, the scanning framing blade apparatus 300 is an element of a lithographic system. The lithographic system comprises an illumination source that projects radiation in the form of an illumination slot, a reticle stage that moves a reticle across the illumination slot during a substrate scanning process, the scanning framing blade apparatus 300 that controls illumination onto the reticle by blocking portions of the reticle from the illumination slot, and a substrate stage that scans a substrate in synchronization with the motion of the reticle stage.

The elements of the scanning framing blade apparatus 300 are described below in greater detail with reference to FIGS. 4, 5A, 5B, 6A, and 6B.

3. Stationary Assembly

Figure 4:
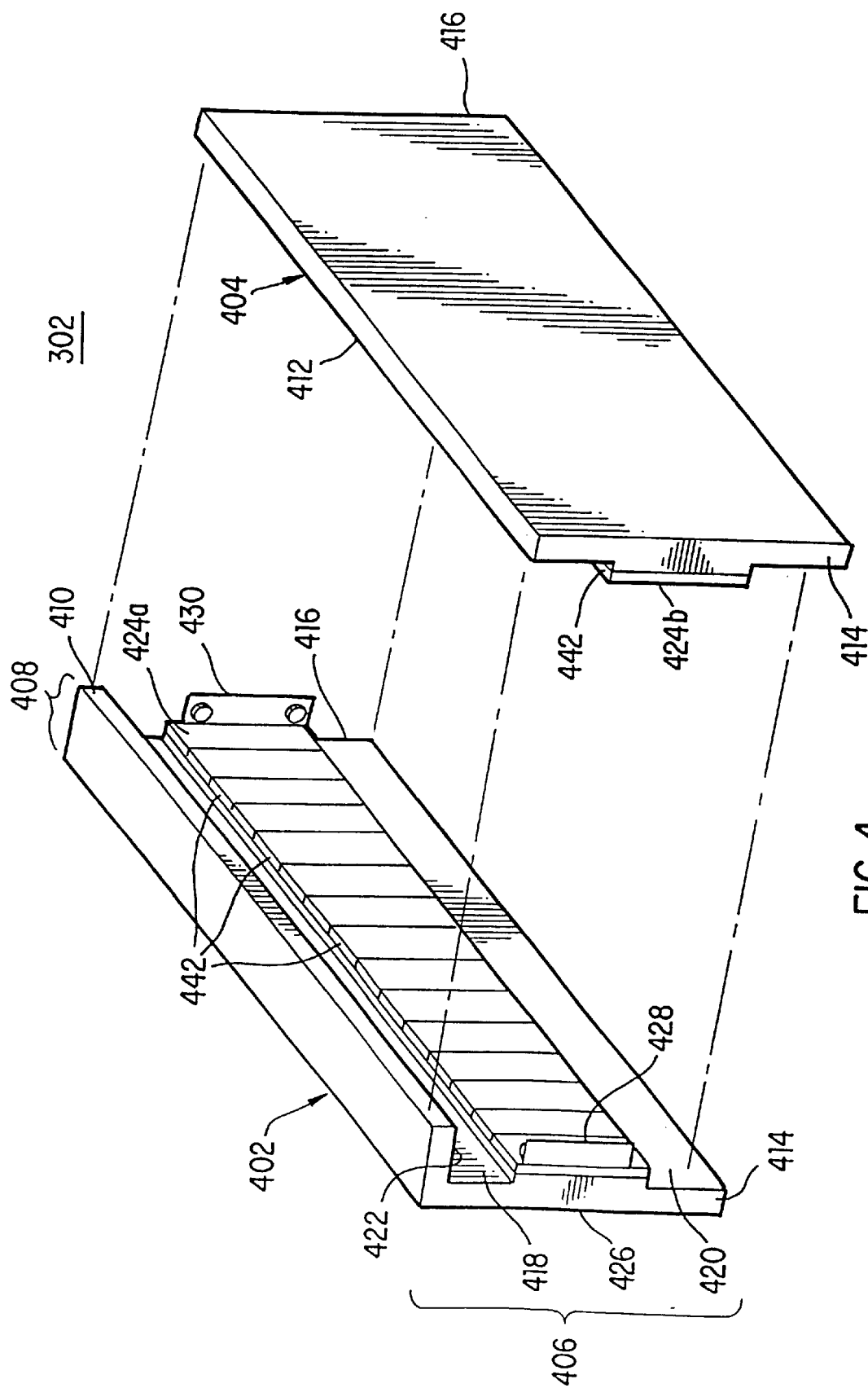
FIG. 4 is an exploded view of a stationary assembly, according to the present invention.

FIG. 4 is an exploded view of the stationary assembly 302 according to a preferred embodiment. The stationary assembly 302 comprises a mounting component 402 and a cover component 404. In a preferred embodiment, the mounting component 402 and the cover component 404 are manufactured from machined steel plates. However, in alternate embodiments, other materials can be used, as would become apparent to a person of ordinary skill in the art. The mounting component 402 and the cover component 404 are substantially parallel. As illustrated in FIG. 4, the mounting component 402 includes a face portion 406 and a flange portion 408. The flange portion 408 includes a receiving surface 410.

The cover component 404 includes a mating surface 412 that mates with the receiving surface 410. The mounting component 402 and the cover component 404 are attached at these surfaces according to any appropriate attaching means known by persons skilled in the relevant arts, such as bolts, screws, rivets, welding, soldering, or the like. However, in alternate embodiments, the mounting and cover components 402 and 404 can be formed of a single piece of material.

The stationary assembly 302 has a first end 414 and a second end 416 opposite to the first end 414. The mounting component 402 of the stationary assembly 302 comprises three surfaces. These three surfaces are a first track surface 418, a second track surface 420, and a third track surface 422. Each of these track surfaces extends from the first end 414 to the second end 416. In a preferred embodiment, the first track surface 418 and the second track surface 420 are formed on the face portion 406 and lie in substantially parallel planes. The third track surface 422 is formed on the flange portion 408 and lies in a plane substantially orthogonal to the first track surface 418. In a preferred embodiment, the first track surface 418, the second track surface 420, and the third track surface are ground to +/−5 micron surface flatness to provide surfaces for air bearings to support the first carriage assembly 304a and the second carriage assembly 304b. This degree of flatness will ensure that both the first framing blade 306a and the second framing blade 306b move in an accurate plane of travel. Opposite to the first and second track surfaces 418 and 420, the face portion 406 of the mounting component 402 includes an outward surface 426.

As described above, the stationary assembly 302 comprises a plurality of magnets 442. These magnets 442 are disposed along a first magnet track 424a and a second magnet track 424b (not shown). The first magnet track 424a is located on the mounting component 402, while the second magnet track 424b is located on the cover component 404. The first magnet track 424a and the second magnet track 424b both extend from the first end 414 to the second end 416. The first magnet track 424a is opposite and substantially parallel to the second magnet track 424b. In an embodiment of the present invention, each magnet track 424 comprises 15 magnets 442. However, other quantities can be used. The plurality of magnets 442 that make up the first and second magnet tracks 424a and 424b are flat, permanent magnets of the NdFeBo type, having dimensions of 20 mm×55 mm×6 mm, and generating a peak magnetic field of approximately 5500 gauss. Such magnets enable both first and second framing blades 306a and 306b to accelerate at 40 m/sec$^2$ at 2.5 watts thermal power. However, in alternate embodiments, other magnets, such as those commonly used in linear motors, can be used.

The stationary assembly 302 further comprises a first hard stop 428 and a second hard stop 430. The first and second hard stops 428 and 430 are mounted to the mounting component 402 at the first end 414 and the second end 416, respectively. The first and second hard stops 428 and 430 serve as safety measures in the case that the first carriage assembly 304a and/or the second carriage assembly 304b reaches the first end 414 and/or the second end 416. In a preferred embodiment, each of the first and second hard stops 428 and 430 comprises a preloaded coil spring that enables either first carriage assembly 304a or second carriage assembly 304b to be stopped in six millimeters from an initial velocity of 1.2 meters/second, with a maximum force of 20 times the force of gravity.

As described above, the stationary assembly 302 is manufactured from ground steel plates. The stationary assembly 302 is also plated with electroless nickel that is hardened after plating. This plating prevents corrosion of the underlying steel, while maintaining the above stated degrees of flatness for the first track surface 418, the second track surface 420, and the third track surface 422.

4. Carriage Assemblies

Figure 5A:
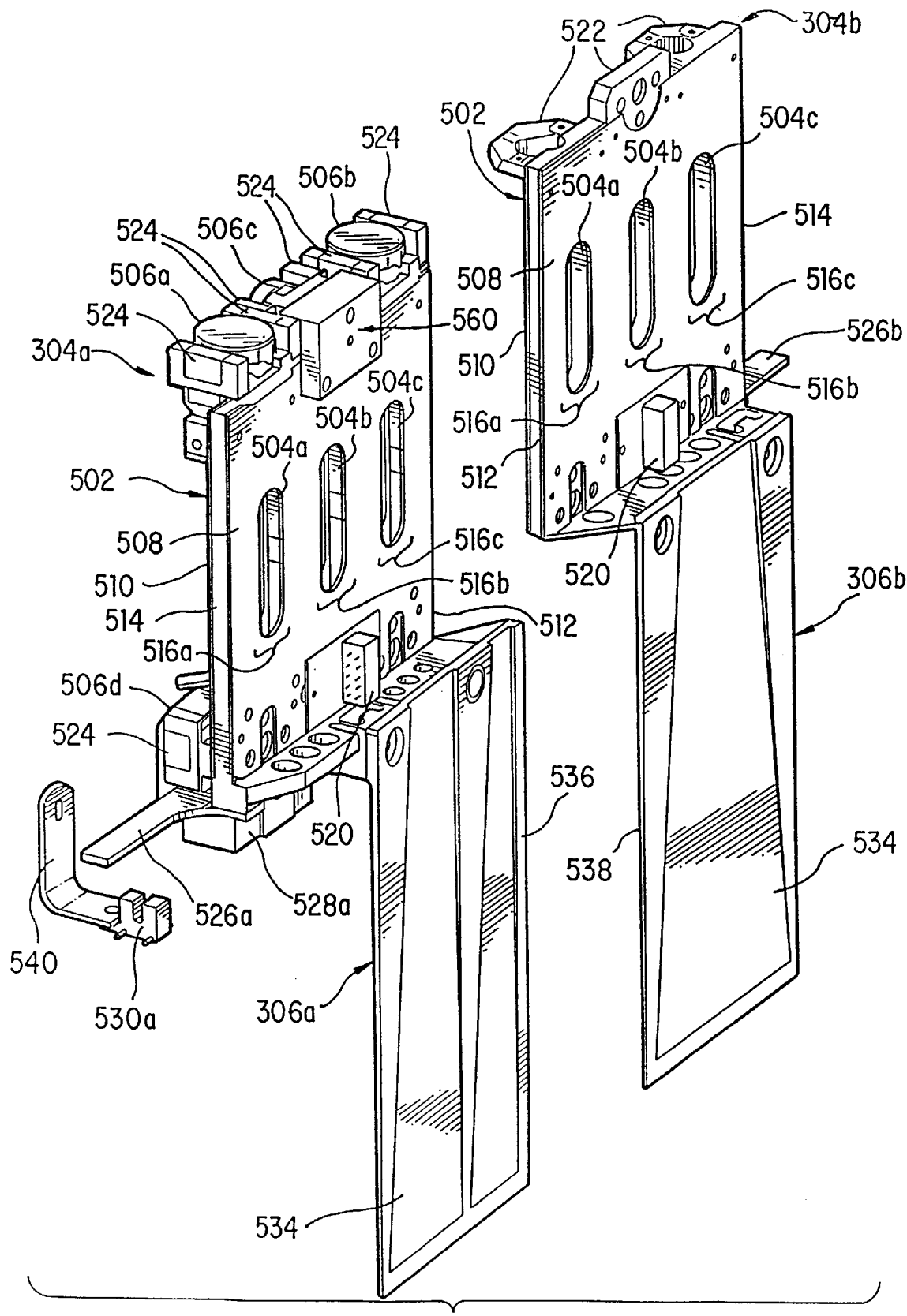
FIGS. 5A, 5B, and 5C are views of a first and a second carriage assembly, according to the present invention.
Figure 5B:
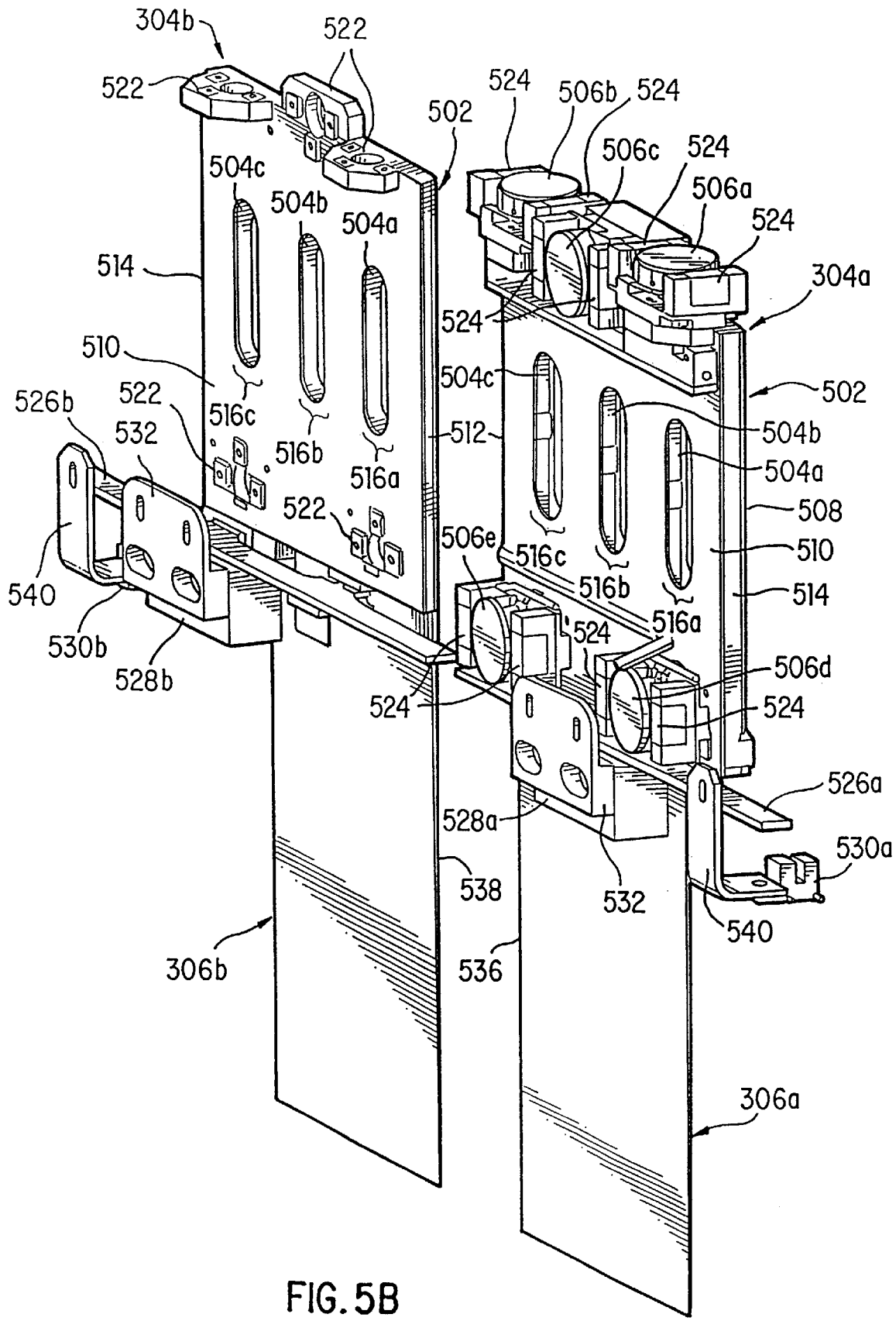

FIGS. 5A and 5B are views of the first carriage assembly 304a and the second carriage assembly 304b according to a preferred embodiment. The first and second carriage assemblies 304a and 304b each comprise a frame 502, a first coil 504a, a second coil 504b, a third coil 504c, a first air bearing 506a, a second air bearing 506b, a third air bearing 506c, a fourth air bearing 506d, and a fifth air bearing 506e.

In a preferred embodiment, the frame 502 comprises a first structural plate 508 and a second structural plate 510. These plates are substantially parallel. The frame 502 further comprises a plurality of beams (not shown) that fasten the first and second structural plates 508 and 510. The first and second structural plates 508 and 510 and the beams are preferably made from G10 epoxy glass circuit board material and bonded together with epoxy. G10 circuit board material is well known to persons skilled in the relevant arts. In alternate embodiments, other materials, means of fastening, and/or configurations can be employed. For example, aluminum beams can be used to support the first and second structural plates 508 and 510.

G10 circuit board material is a preferred material because it has a high resistivity, and therefore, will insulate the coil to the frame during operation of the scanning framing blade apparatus 300. In a preferred embodiment, the frame 502 is made from G10 material having the following characteristics:

Tensile Strength: $5 \times 10^7$ Pa

Elastic Modulus: $2.0 \times 10^{10}$ Pa

Density: 1.8 gm / cm$^3$

Thermal Coefficient of Expansion: $10 \times 10^{-6}$ 1/deg C

Thermal Conductivity: 0.35 watt/m·deg C

Electrical Conductivity: $7.0 \times 10^{13}$ ohm·c

However, in alternate embodiments, G10, or other materials, having different characteristics can be used, as would be apparent to a person of ordinary skill in the art.

Each of the frames 502 has a confronting end 512 and a retreating end 514 that is opposite to the confronting end 512. In a preferred embodiment, the confronting end 512 of the first carriage assembly 304a faces the confronting end 512 of the second carriage assembly 304b.

The first and second structural plates 508 and 510 include portions that define a first coil fitting 516a, a second coil fitting 516b, and a third coil fitting 516c. Each of these coil fittings 516 extends through the first structural plate 508 and the second structural plate 510. In a preferred embodiment, these coil fittings 516 are evenly spaced between the confronting end 512 and the retreating end 514. However, in alternate embodiments, any number of coil fittings 516 in any spacing can be used, as would become apparent to a person skilled in the relevant arts.

As described above, the first and second carriage assemblies 304a and 304b each comprise a first coil 504a, a second coil 504b, a third coil 504c. Each of these coils 504 are disposed in a corresponding coil fitting 516. In a preferred embodiment, each of the first, second, and third coils are flat wound three phase coils comprising 23 AWG magnet wire of either copper or aluminum. For the first, second, and third coils 504a–c, the force constant is preferably 6.53 newtons/ amp. The resistance of each of the first, second, and third coils 504a–c is preferably 1.4 ohms in the case of aluminum wire and is preferably 0.9 ohms in the case of copper wire. However, other materials, winding configurations, force constants, and resistances can be used in accordance with the present invention, as would become apparent to a person of ordinary skill in the art.

In a preferred embodiment, the first coil 504a, the second coil 504b, and the third coil 504c are coupled together as an integral component. In addition, the first coil 504a, the second coil 504b, and the third coil 504c are coupled to frame 502. These couplings are preferably made with a low shrink epoxy. However, other coupling techniques can be employed, as would be apparent to a person skilled in the relevant arts. In an embodiment of the present invention, each side of the first coil fitting 516a, the second coil fitting 516b, and the third coil fitting 516c can be covered by a material. An exemplary covering material is one millimeter G10 circuit board material. However, other materials can be used, as would become apparent to a person of ordinary skill in the art.

In a preferred embodiment, each of the first and second carriage assemblies 304a and 304b further include one or more aluminum inserts (not shown) placed between the first and second structural plates 508 and 510. These aluminum inserts provide support and dimensional stability. In addition, the air bearing mountings 522 (described below) can be formed out of these inserts. Also, these inserts can provide durable threads for the attachment of the corresponding framing blade 306, electrical connectors, and any other components mounted on each of the first and second carriage assemblies 304a and 304b. Each of these aluminum inserts are preferably bonded to the corresponding carriage assembly 304 with epoxy. However, these aluminum inserts can be fastened to the corresponding carriage assembly 304 by means such as screws, bolts, rivets, and other fasteners that would be apparent to a person skilled in the relevant art.

For each of the carriage assemblies 304a and 304b, the first, second, and third coils 504a–c are electrically connected to the controller 308. In a preferred embodiment, these connections are made through a first and a second cable (not shown) that are attached to the first and second carriage assemblies 304a and 304b, respectively. Each of the first and second cables are attached to the corresponding carriage assembly 304 with a connector 520 that is mounted on the corresponding carriage assembly 304. In a preferred embodiment, the connector 520 is a multiple pin connector mounted on an aluminum insert, as described above. Each of the first and second cables are preferably high flex TEFLON (trademark) ribbon cable. However, other types of cables, connectors, and electrical connections can be employed, as would be apparent to a person of ordinary skill in the art.

As described above, each of the first and second carriage assemblies 304a and 304b comprises a first air bearing 506a, a second air bearing 506b, a third air bearing 506c, a fourth air bearing 506d, and a fifth air bearing 506e. These air bearings 506a–e support the corresponding carriage assembly 304 on the stationary assembly 302 and permit the corresponding carriage assembly 304 to move in only one degree of freedom. Each of these air bearings 506a–e provides support for the corresponding carriage assembly 304 at either the first track surface 418, the second track surface 420, or the third track surface 422. Each of first, second, third, fourth, and fifth air bearings 506a–e are coupled to the corresponding carriage assembly 304 by a corresponding air bearing mounting 522. In a preferred embodiment, each air bearing mounting 522 is formed from an aluminum insert, as described above. The air bearings 506a–e are described in greater detail below with reference to FIGS. 6A, 6B, and 6C.

The first and second carriage assemblies 304a and 304b each comprise a plurality of preloading magnets 524. Each of these preloading magnets 524 corresponds to one of the air bearings 506a–506e. These preloading magnets 524 provide an attractive force between the corresponding air bearing 506 and either the first track surface 418, the second track surface 420, or the third track surface 422. In a preferred embodiment, there are two preloading magnets 524 for each of the air bearings 506a–e. These preloading magnets 524 are preferably permanent magnets and are attached to the air bearing mountings 522.

Each of the first and second carriage assemblies 304a and 304b also includes a counterweight 560. The counterweight 560 aligns the center of gravity of each carriage assembly 304 and corresponding framing blade 306 with the corresponding first, second, and third coils 504a–c.

Figure 5C:
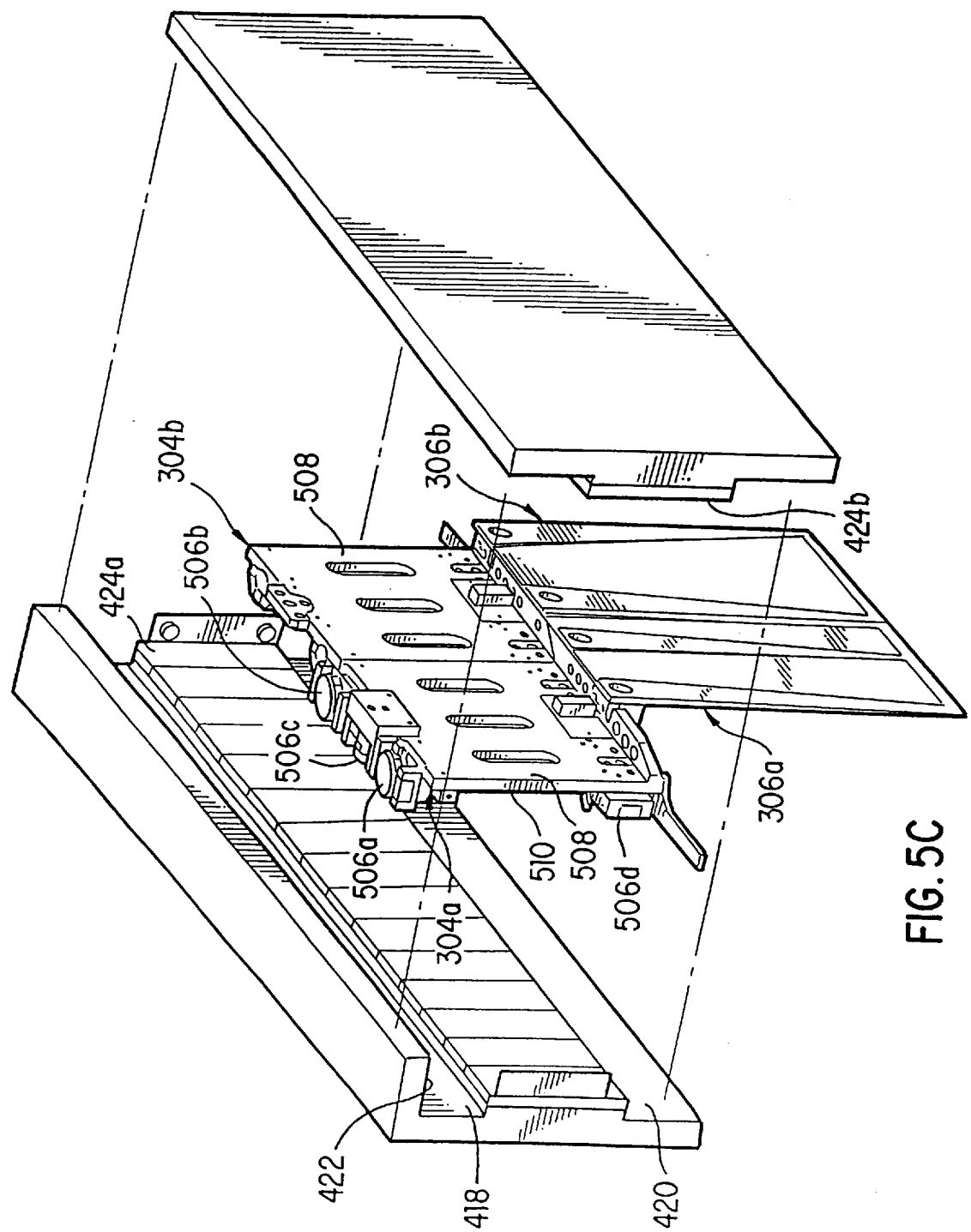

FIG. 5C is an exploded view illustrating the relationship between the stationary assembly 302, the first and the second carriage assemblies 304a and 304b, and the first and second framing blades 306a and 306b. As shown in FIG. 3C, the first and second carriage assemblies 304a and 304b are disposed between the mounting component 402 and the cover component 404 of the stationary assembly 302. In a preferred embodiment, the first and second structural plates 508 and 510 are substantially parallel to the first and second magnet tracks 424a and 424b.

As described above, each of the first and second carriage assemblies 304a and 304b each preferably comprises five air bearings 506a–e that support the corresponding carriage assembly on the stationary assembly 302. FIG. 5C illustrates the manner in which these air bearings 506a–e support the first carriage assembly 304a. The first and second air bearings 506a and 506b support the first carriage assembly 304a at the third track surface 422. The third air bearing 506c supports the first carriage assembly 3 04a at the first track surface 418. The fourth and fifth air bearings 506d and 506e support first the first carriage assembly 304a at the second track surface 420.

Although not shown in FIG. 5C, each of the five air bearings 506a–e for the second carriage assembly 304b, provide support for the second carriage assembly 304b at the same track surfaces as described with reference to the first carriage assembly 304a.

As described below with reference to FIGS. 6A–6C, each of the air bearings 506a–e expel air towards either the first track surface 418, the second track surface 420, or the third track surface 422. This expulsion of air creates an air cushion between each of the air bearings 506a–e and the corresponding track surface. This air is provided to each of the first and second carriage assemblies 304a and 304b by first and second air supply tubes (not shown), respectively. These air supply tubes are connected to an air supply (not shown). In a preferred embodiment, the first carriage assembly 304a comprises a first tube connector (not shown) that connects to the first air supply hose and distributes supplied air to each of the air bearings 506a–e mounted on the first carriage assembly 304a via five separate tubes (not shown). Likewise, the second carriage assembly 304b comprises a second tube connector (not shown) that connects to the second air supply hose and distributes supplied air to each of the air bearings 506a–e mounted on the second carriage assembly 304a via five separate tubes (not shown).

5. Framing Blades

As illustrated in FIGS. 5A–C, the first and second framing blades 306a and 306b are attached to the first and second carriage assemblies 304a and 304b, respectively. The first and second framing blades 306a and 306b extend beyond the area that is between the mounting component 402 and the cover component 404 of the stationary assembly 302. In a preferred embodiment, each of the first and second framing blades 306a and 306b attach to the corresponding carriage assembly 304 with a solid insert (not shown) and a flexural insert (not shown) that is compliant with the one degree of freedom in which the corresponding framing blade 306 moves. These inserts are preferably bonded to the corresponding carriage assemblies with epoxy. In alternate embodiments, the first and second framing blades 306a and 306b can attach to the corresponding carriage assembly 304 by other techniques known to persons of ordinary skill in the art, such as bolts, screws, epoxy, and the like.

Each of the first and second framing blades 306a and 306b comprises a framing face 534. Each framing face is configured to obstruct a portion of a reticle from an illumination slot during the substrate scanning process. First framing blade 306a comprises a first framing edge 536. Second framing blade 306b comprises a second framing edge 538 that is opposite to and confronts first framing edge 536.

6. Position Determination Mechanism

As described above, the scanning framing blade apparatus 300 comprises a position determination mechanism 310. The position determination mechanism 310 determines the positions of the first and second framing blades 306a and 306b, and provides framing blade position information to the controller 308. The position determination mechanism 310 is described in detail with reference to FIGS. 5A and 5B. In a preferred embodiment, the position determination mechanism 310 comprises first and second encoder scales 526a and 526b, and first and second optical readers 528a and 528b, In addition, the position determination mechanism 310 comprises first and second limit flags 530a and 530b. The first and second encoder scales 526a and 526b are attached to the first carriage assembly 304a and the second carriage assembly 304b, respectively.

In a preferred embodiment, the first and second encoder scales 526a and 526b are attached to the corresponding carriage assembly 304 with one or more aluminum inserts, as described above. The first and second encoder scales 526a and 526b are preferably model RGS-S scales with 20 micrometer pitch made by Renishaw plc of Gloucestershire, United Kingdom. However, other encoder scales can be used, as would become apparent to a person of ordinary skill in the art.

The first and second optical readers 528a and 528b correspond to the first and second encoder scales 526a and 526b, respectively. As described above, each of the first and second optical readers 528a and 528b detects the position and/or motion of the corresponding encoder scale 526 and generates a signal representing this motion and/or position. This signal is transmitted to controller 308 through a cable. However, this signal can be transmitted to controller 308 through any medium known to persons skilled in the relevant arts, such as a wireless RF link, an optical communications link, or the like. In a preferred embodiment, the first and second optical readers 528a and 528b are attached to the mounting component 402 of the stationary assembly 302. For each of the first and second optical readers 528a and 528b, this attachment is preferably made with a reader mounting 532 that couples to the outward surface 426 of the mounting component 402. However, in alternate embodiments, the first and second optical readers 528a and 528b can be attached to the stationary assembly 302 in any manner that would be apparent to a person of ordinary skill in the art. The first and second optical readers 528a and 528b are preferably model RGH-24 encoders made by Renishaw plc of Gloucestershire, United Kingdom. However, other optical readers can be used, as would become apparent to a person of ordinary skill in the art.

In a preferred embodiment, the first and second limit flags 530a and 530b correspond to the first and second encoder scales 526a and 526b, respectively. Each of the first and second limit flags 530a and 530b detects the position and/or motion of the corresponding encoder scale 526 and generates a signal when the corresponding carriage assembly 304 is near the either the first end 414 or the second end of 416 of the stationary assembly 302. This signal is transmitted to controller 308 through a cable. However, this signal can be transmitted to controller 308 through any medium known to persons skilled in the relevant arts, such as a wireless RF link or an optical communications link. In a preferred embodiment, the first and second limit flags 530a and 530b are attached to the mounting component 402 of the stationary assembly 302. For each of the first and second limit flags 530a and 530b, this attachment is preferably made with a limit flag mounting 540 that couples to the outward surface 426 of the mounting component 402. However, in alternate embodiments, the first and second limit flags 530a and 530b can be attached to the stationary assembly 302 in any manner that would be apparent to a person of ordinary skill in the art. The first and second limit flags 530a and 530b are preferably model OPB821 slotted optical switches made by Optek, Inc. of Carrollton, Tex. However, the first and second limit flags 530a and 530b can be implemented with other devices, as would become apparent to a person of ordinary skill in the art.

7. Air Bearings

Figure 6A:
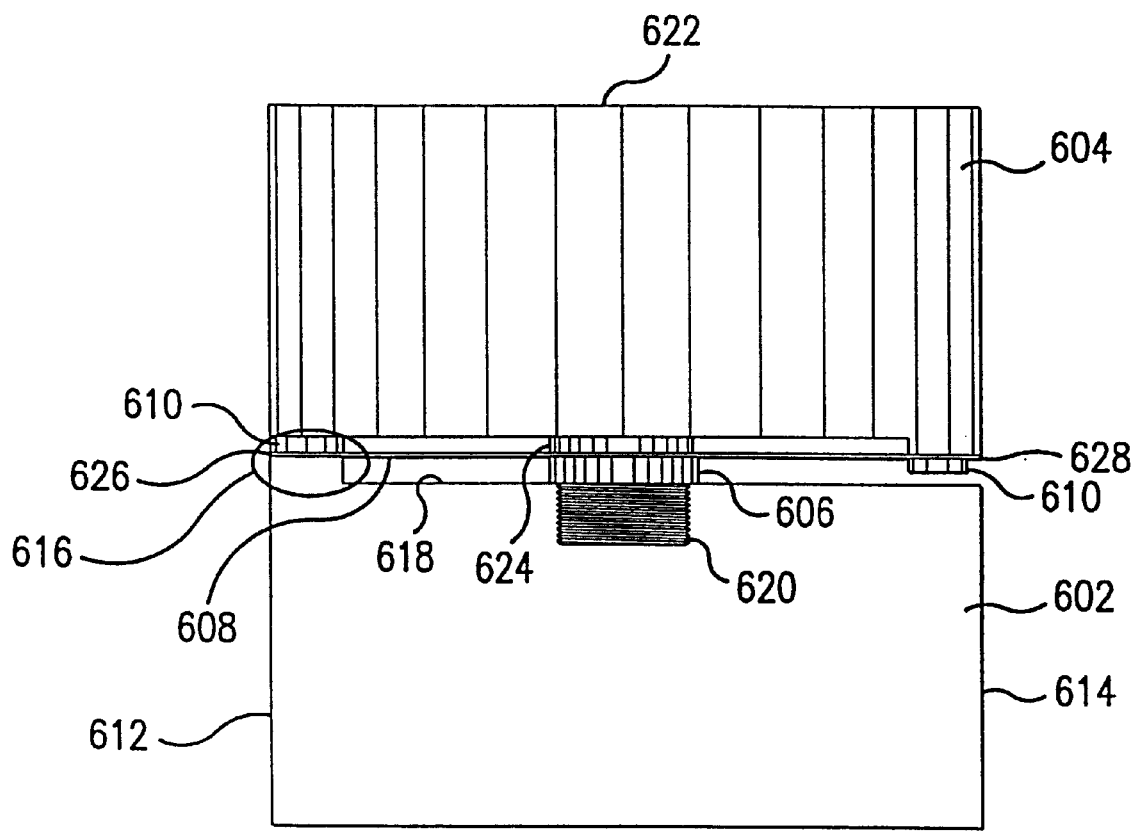
FIGS. 6A, 6B, and 6C are views of an air bearing, according to the present invention.
Figure 6B:
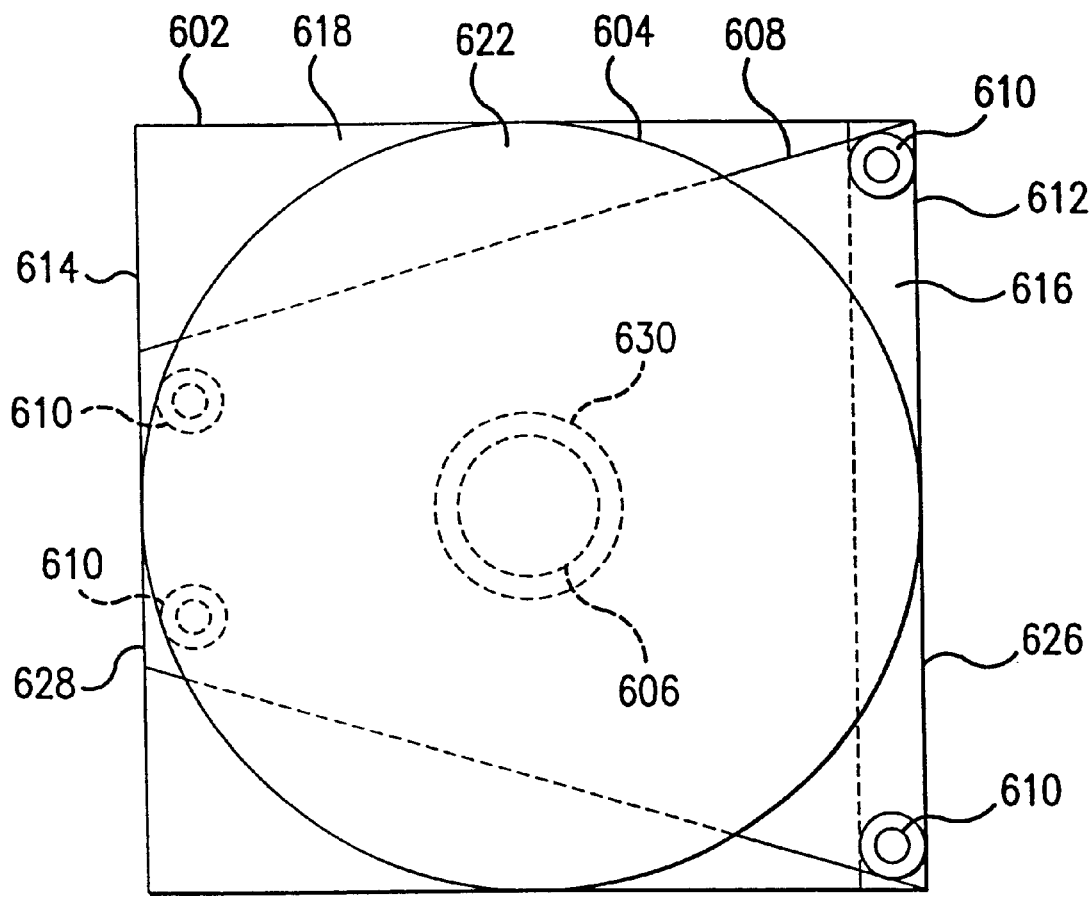

FIGS. 6A and 6B illustrate side and top views of an air bearing 506, respectively. Each of the air bearings 506a–e comprises a mounting base 602, an air bearing pad 604, an adjustment and locking screw 606, a flexure 608, and four flexure mounting screws 610.

In a preferred embodiment, the mounting base 602 attaches to a corresponding bearing mounting 522 on either the first carriage assembly 304a or the second carriage assembly 304b. The mounting base 602 comprises a flexure attaching end 612 and a free end 614 that is opposite to the flexure attaching end 612. At the flexure attaching end 612, the mounting base 602 has a ridge 616. Between the ridge 616 and the free end 614, the mounting base 602 includes a base surface 618. A threaded cavity 620 is formed in the base surface 618 to receive the adjustment and locking screw 606. The mounting base 602 is preferably made of hardened steel. However, other materials can be used, as would be apparent to a person of ordinary skill in the art.

The air bearing pad 604 comprises a pad surface 622 and an adjustment and locking screw contact surface 624. The pad surface 622 faces either the first track surface 418, the second track surface 420, or the third track surface 422. The adjustment and locking screw contact surface 624 contacts the adjustment and locking screw 606. The air bearing pad 604 expels air towards either the first track surface 418, the second track surface 420, or the third track surface 422. This expulsion of air creates an air cushion between the air bearing 506 and the corresponding track surface. In a preferred embodiment, the air bearing pad 604 is a 0.75 inch porous carbon pad made by Devitt Machine, Inc. of Aston, Pa. having the following characteristics:

Stiffness Figure of Merit: $2.5 \times 10^{10}$ newton/meter$^3$

Diameter: 0.75 inches

Axial Stiffness: $7.13 \times 10^6$ newton/meter

Torsional Stiffness: $1.62 \times 10^2$ newton·meter/rad

Preload Force: 75 newtons

The ultimate load bearing capacity of the air bearing pad 604 is preferably three times the preload force. Thus, for the parameters, listed above, the load bearing capacity would be approximately 200 newtons. In alternate embodiments, other materials, products, and/or devices that have different characteristics can be used, as would be apparent to a person of ordinary skill in the art.

In a preferred embodiment, 60–80 psi nitrogen is supplied to the air bearing pad 604. However, other gases at other pressures can be applied. This supplied nitrogen is expelled through the air bearing pad 604 to create the air cushion described above. Although not shown, tubing provides the nitrogen to the air bearing pad 604 through a barb and an insert barb fitting. In a preferred embodiment, the present invention supplies air to the air bearing pad 604 using the following components: Polyurethane semi-rigid tubing (0.05 gm/cm 1/16" internal diameter, 1/32" wall); MHPR-1012 insert barb fitting made by Beswick Engineering Co., Inc. of Greenland, N.H.; and MHT-3012 Tee Barb made by Beswick Engineering Co., Inc. of Greenland, N.H. In alternate embodiments, the present invention can use other components, devices, and techniques to provide an air cushion, as would be apparent to a person of ordinary skill in the art.

As illustrated in FIG. 6B, the flexure 608 comprises a first flexure end 626, and a second flexure end 628. The first flexure end 626 is attached to the flexure attaching end 612 of the mounting base 602 by two of the four flexure mounting screws 610. The second flexure end 628 is attached to the air bearing pad 604 by the other two of the four flexure mounting screws 610. The flexure 608 provides the air bearing pad 604 with flexibility to align properly with either the first track surface 418, the second track surface 420, or the third track surface 422. The flexure 608 forms a flexure aperture 630 that is configured to allow the adjustment and locking screw 606 to contact the adjustment and locking screw contact surface 624. In a preferred embodiment, the flexure 608 comprises beryllium copper, and has the following properties:

Stiffness: 1.0 newton/rad
length: 0.75 inches
Elastic modulus: $1.3 \times 10^{11}$ Pa
Thickness: 0.018 inches However, other materials, with other properties can be used to implement the flexure 608, as would be apparent to a person of ordinary skill in the art.

Figure 6C:
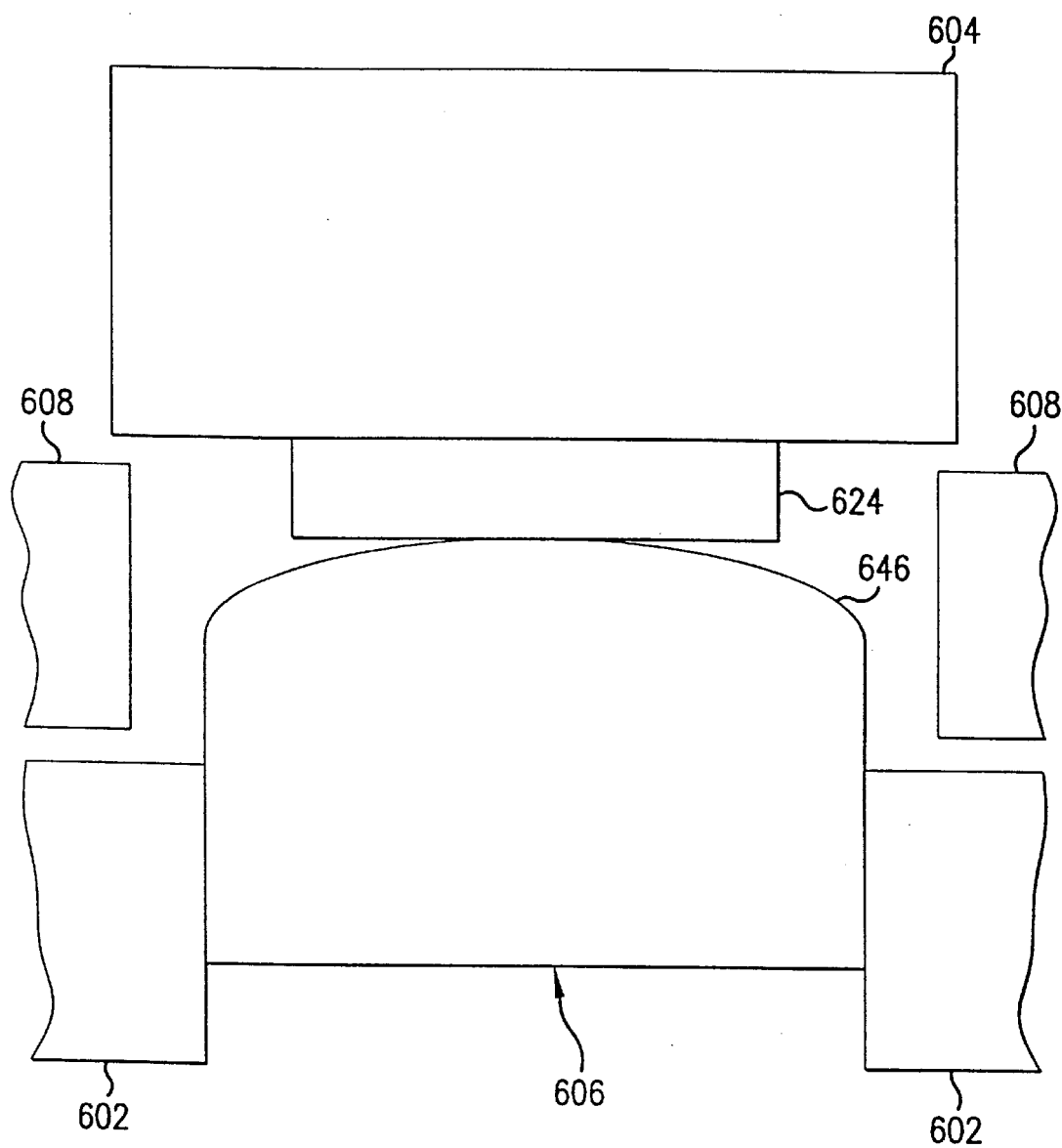

FIG. 6C is a cut away side view of an air bearing 506 (not drawn to scale). As described above, the adjustment and locking screw contact surface 624 on the air bearing pad 604 contacts the adjustment and locking screw 606. In particular, the adjustment and locking screw contact surface 624 contacts a surface 646 of the adjustment and locking screw 606. The adjustment and locking screw 606 sets the distance between the air bearing pad 604 and the mounting base 602. As illustrated in FIG. 6C, the surface 646 is rounded. This gives the corresponding air bearing pad 604 the freedom of motion to align properly with the corresponding track surface, while maintaining a certain distance between the air bearing pad 604 and the mounting base 602. This alignment of the air bearing pad 604 is known as "self-centering".

8. Controller

As described above with reference to FIG. 3, the present invention includes a controller 308. The controller 308 can receive commands from a master control system that directs the controller 308 to cause each carriage assembly 304 to move in a particular manner. To cause each carriage assembly 304 to move, the controller 308 energizes coils 504 in each carriage assembly 304 in a particular manner known as commutation. In addition, the controller 308 receives framing blade position information from the position determination mechanism 310.

The controller 308 can be implemented as hardware, firmware, software or any combination thereof, and can be implemented in one or more computer systems and/or other processing systems. In one embodiment, the controller 308 is implemented by one or more computer systems capable of carrying out the functionality described herein.

Figure 7:
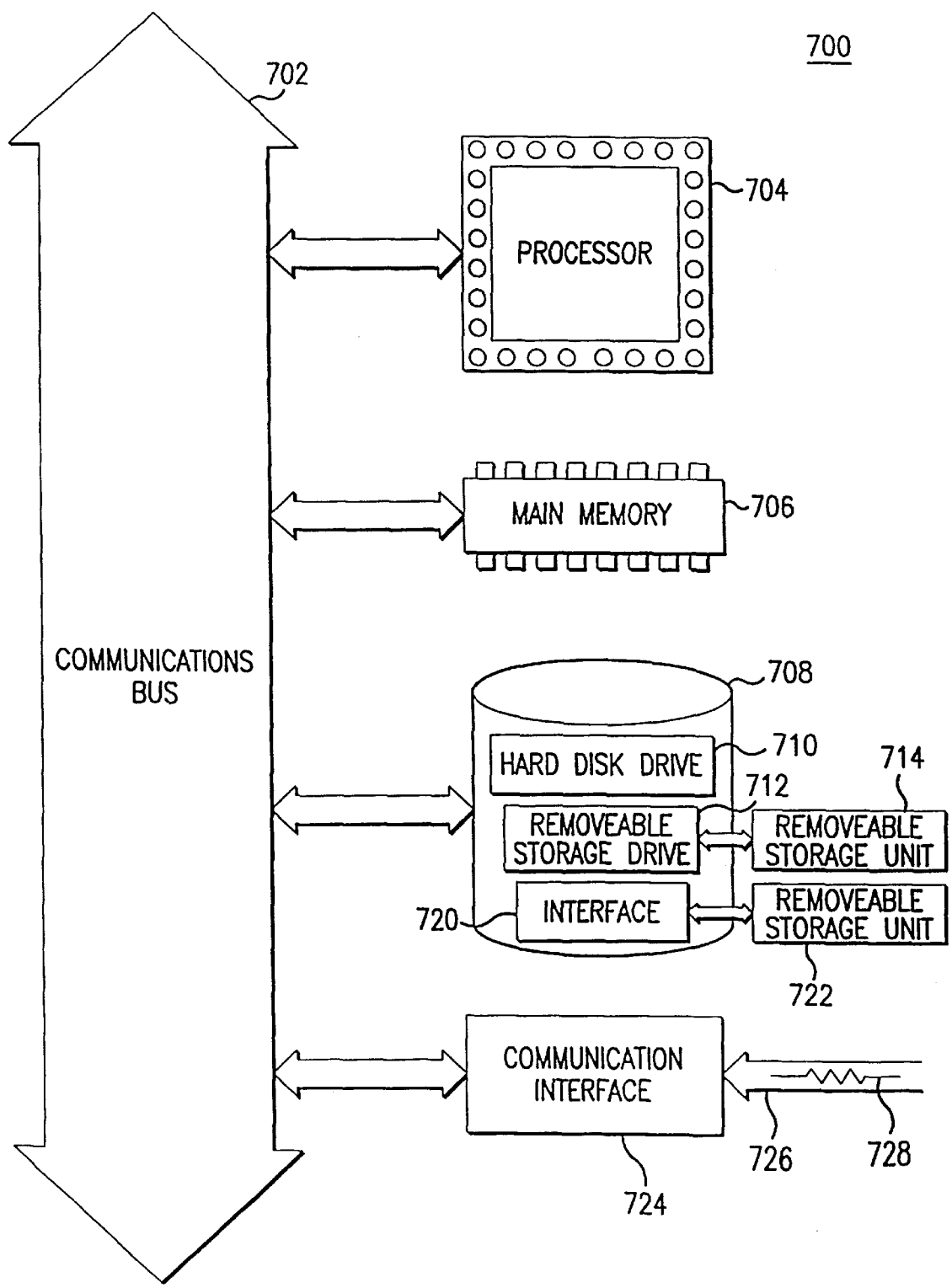
FIG. 7 is a block diagram of an exemplary computer system, according to the present invention.

FIG. 7 is a block diagram of an exemplary computer system 700. Computer system 700 includes one or more processors, such as processor 704. Processor 704 is connected to a communication bus 702. Various software embodiments are described in terms of this example computer system 700. After reading this description, it will become apparent to a person skilled in the relevant art how to implement the invention using other computer systems and/or computer architectures.

Computer system 700 also includes a main memory 706, preferably random access memory (RAM), and can also include a secondary memory 708. Secondary memory 708 can include, for example, a hard disk drive 710 and/or a removable storage drive 712, representing a floppy disk drive, a magnetic tape drive, an optical disk drive, etc. Removable storage drive 712 reads from and/or writes to a removable storage unit 714 in a well known manner. Removable storage unit 714, represents a floppy disk, magnetic tape, optical disk, etc. which is read by and written to by removable storage drive 712. Removable storage unit 714 includes a computer usable storage medium having stored therein computer software and/or data.

In alternative embodiments, secondary memory 708 can include other similar means for allowing computer programs or other instructions to be loaded into computer system 1904. Such means can include, for example, a removable storage unit 722 and an interface 720. Examples of such can include a program cartridge and cartridge interface (such as that found in video game devices), a removable memory chip (such as an EPROM, or PROM) and associated socket, and other removable storage units 722 and interfaces 720 which allow software and data to be transferred from the removable storage unit 722 to computer system 700.

Computer system 700 can also include a communications interface 724. Communications interface 724 allows software and data to be transferred between computer system 700 and external devices. Examples of communications interface 724 include, but are not limited to a modem, a network interface (such as an Ethernet card), a communications port, a PCMCIA slot and card, etc. Software and data transferred via communications interface 724 are in the form of signals which can be electronic, electromagnetic, optical or other signals capable of being received by communications interface 724. These signals 726 are provided to communications interface via a channel 728. This channel 728 carries signals 726 and can be implemented using wire or cable, fiber optics, a phone line, a cellular phone link, an RF link and other communications channels. In one embodiment, the controller 308 can energize coils 504, receive framing blade position information from the position determination mechanism 310, and receive commands from a master control system through communications interface 724.

In this document, the terms "computer program medium" and "computer usable medium" are used to generally refer to media such as removable storage device 712, a hard disk installed in hard disk drive 710, and signals 726. These computer program products are means for providing software to computer system 704.

Computer programs (also called computer control logic) are stored in main memory and/or secondary memory 708. Computer programs can also be received via communications interface 724. Such computer programs, when executed, enable the computer system 700 to perform the features of the present invention as discussed herein. In particular, the computer programs, when executed, enable the processor 704 to perform the features of the present invention.

In an embodiment where the invention is implemented using software, the software can be stored in a computer program product and loaded into computer system 700 using removable storage drive 712, hard drive 710 or communications interface 724. The control logic (software), when executed by the processor 704, causes the processor 704 to perform the functions of the invention as described herein.

In another embodiment, the controller 308 is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the controller 308 is implemented using a combination of both hardware and software.

9. Conclusion

While various embodiments of the present invention have been described above, it should be understood that they have been presented by way of example only, and not limitation. For example, while the invention has been described in terms of a wafer, one skilled in the art would recognize that the instant invention could be applied to any type of substrate used in a lithography process. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A scanning framing blade apparatus, comprising.

a stationary assembly having a plurality of magnets;

first and second carriage assemblies, each of said first and second carriage assemblies having a plurality of coils, wherein said first and second carriage assemblies are supported on said stationary assembly by a plurality of air bearings, said air bearings permitting said first and second carriage assemblies to move in only one degree of freedom;

first and second framing blades attached to said first and second carriage assemblies, respectively; and a controller coupled to said plurality of coils, wherein said controller is adapted to energize at least one of said plurality of coils, thereby causing at least one of said carriage assemblies and corresponding framing blade to move in said one degree of freedom to control illumination onto a reticle during a substrate scanning process.

2. The scanning framing blade apparatus of claim 1, further comprising a position determination mechanism that provides framing blade position information to said controller.

3. The scanning framing blade apparatus of claim 2, wherein said position determination mechanism comprises:

first and second encoder scales coupled to said first and second carriage assemblies, respectively; and first and second readers coupled to said stationary assembly that determine framing blade position information on from said first and second encoder scales, respectively.

4. The scanning framing blade apparatus of claim 1, wherein each of said first and second carriage assemblies comprises a counterweight that aligns the center of gravity of the carriage assembly with said plurality of coils.

5. The scanning framing blade apparatus of claim 1, wherein said stationary assembly further comprises first, second, and third track surfaces;

wherein each of said plurality of air bearings provides carriage assembly support at one of said first, second, and third track surfaces.

6. The scanning framing blade apparatus of claim 5, wherein said first and second track surfaces lie in substantially parallel planes; and wherein said first and third track surfaces lie in substantially orthogonal planes.

7. The scanning framing blade apparatus of claim 5, wherein each of said first and second carriage assemblies further comprises a plurality of preloading magnets, each of said preloading magnets providing an attractive force between one of said plurality of air bearings and a corresponding track surface.

8. The scanning framing blade apparatus of claim 5, wherein each of said air bearings comprises:

a mounting base attached to a corresponding carriage assembly, said mounting base having a flexure attaching end;

an air bearing pad having a pad surface that faces one of said first, second, and third track surfaces; and a flexure having a first end attached to said mounting base at said flexure attaching end, and a second end attached to said air bearing pad, thereby enabling said air bearing pad to align with said track surface.

9. The scanning framing blade apparatus of claim 8, wherein each of said air bearings further comprises an adjustment and locking screw attached to said mounting base, said adjustment and locking screw having a rounded surface; and wherein each of said air bearing pads comprises an adjustment and locking screw contact surface that contacts said corresponding adjustment and locking screw at said rounded surface, thereby providing said air bearing pad freedom of motion to align with said track surface, while maintaining a certain distance between said air bearing pad and said mounting base.

10. The scanning framing blade apparatus of claim 1, wherein each framing blade comprises a framing face, each framing face configured to obstruct a portion of a reticle from an illumination slot during the substrate scanning process.

11. The scanning framing blade apparatus of claim 1, wherein said controller causes said first and second framing blades to move in synchronization with a scanning reticle to prevent pinhole exposure onto a substrate.

12. The scanning framing blade apparatus of claim 1, wherein said controller causes said first and second framing blades to move in synchronization with a scanning reticle to control the reticle field width.

13. A lithographic system, comprising:

an illumination source that projects radiation in the form of an illumination slot;

a reticle stage that moves a reticle across the illumination slot during a substrate scanning process;

a scanning framing blade apparatus that controls illumination onto the reticle by blocking portions of the reticle from the illumination slot, the scanning framing blade apparatus comprising:
  a) a stationary assembly having a plurality of magnets;
  b) first and second carriage assemblies, each of said first and second carriage assemblies having a plurality of coils, wherein said first and second carriage assemblies are supported on said stationary assembly by a plurality of air bearings, said air bearings permitting said first and second carriage assemblies to move in only one degree of freedom;
  c) first and second framing blades attached to said first and second carriage assemblies, respectively; and
  d) a controller coupled to said plurality of coils, wherein said controller is adapted to energize at least one of said plurality of coils, thereby causing at least one of said carriage assemblies and corresponding framing blade to move in said one degree of freedom to control illumination onto the reticle during a substrate scanning process; and
a substrate stage that scans a substrate in synchronization with the motion of the reticle stage.

14. In a scanning framing blade apparatus comprising a stationary assembly, first and second carriage assemblies, each of said first and second carriage assemblies having a plurality of coils, first and second framing blades attached to said first and second carriage assemblies, respectively, a controller coupled to said plurality of coils, wherein said controller is adapted to energize at least one of said plurality of coils, and a position determination mechanism that provides framing blade position information to said controller, a method for performing a scanning operation, the method comprising receiving a command from a master control system;

receiving framing blade position information from the position determination mechanism;

processing the position information; and energizing the coils in at least one of the carriage assemblies, thereby driving the first and second framing blades in a manner that is consistent with the command received from the master control system.

* * * * *